(12) United States Patent
Iba

(10) Patent No.: US 7,452,795 B2
(45) Date of Patent: Nov. 18, 2008

(54) SEMICONDUCTOR DEVICE AND METHOD FOR FABRICATING THE SAME

(75) Inventor: Yoshihisa Iba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 383 days.

(21) Appl. No.: 11/205,991

(22) Filed: Aug. 18, 2005

(65) Prior Publication Data

US 2006/0270214 A1    Nov. 30, 2006

(30) Foreign Application Priority Data

May 30, 2005  (JP)  ............... 2005-157018

(51) Int. Cl.
*H01L 21/44*    (2006.01)

(52) U.S. Cl. ............... 438/597; 438/623; 438/624; 438/687; 438/723; 438/727; 257/E21.024; 257/E21.029; 257/E21.578

(58) Field of Classification Search ............... 438/597; 257/E21.578, E21.024, E21.029
See application file for complete search history.

(56) References Cited

U.S. PATENT DOCUMENTS

| 5,453,403 | A | | 9/1995 | Meng et al. | |
|---|---|---|---|---|---|
| 5,976,963 | A | * | 11/1999 | Cronin et al. | 438/597 |
| 6,764,903 | B1 | * | 7/2004 | Chan et al. | 438/257 |
| 7,067,419 | B2 | * | 6/2006 | Huang et al. | 438/638 |
| 7,078,348 | B1 | * | 7/2006 | Singh et al. | 438/700 |

FOREIGN PATENT DOCUMENTS

| JP | 5-218209 A | 8/1993 |
|---|---|---|
| JP | 2001-168188 A | 6/2001 |
| JP | 2002-43419 A | 2/2002 |
| JP | 2003-197738 A | 7/2003 |

OTHER PUBLICATIONS

Office Action dated Sep. 14, 2007 issued in corresponding Peoples Republic of China Application No. 200510099963.2.

\* cited by examiner

*Primary Examiner*—Michael S Lebentritt
(74) *Attorney, Agent, or Firm*—Westerman, Hattori, Daniels & Adrian, LLP.

(57) ABSTRACT

When a via-hole 26 and an interconnection trench 32 are formed in an interconnection films 16, 18 by using as a mask a hard mask 20 covering the region except via-hole forming region, and a hard mask 22 covering the region except an interconnection trench forming region, the hard mask 20 is isotropically etched to expose the upper surface of the interlayer insulating film 18 at a periphery of the via-hole forming region and leave the hard mask 20 in the interconnection trench forming region except the periphery, and then the hard mask 20 and the insulating films 18, 16 are anisotropically etched, whereby the via-hole 26 having increased-width portion 34 at the upper part, and the interconnection trench 32 connected to the via-hole 26 at the increased-width portions 26 are formed.

12 Claims, 24 Drawing Sheets

SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2005-157018, filed on May 30, 2005, the entire contents of which are incorporated herein by reference.

BACKGROUND OF THE INVENTION

The present invention relates to a semiconductor device and a method for fabricating the same, more specifically, a semiconductor device having the interconnection buried in the inter-layer insulating film formed by the dual damascene process, and a method for fabricating the semiconductor device.

As semiconductor devices are larger scaled and more integrated, the design rule of the interconnections are more diminished as the generations advance. Conventionally, the interconnections are formed by depositing interconnection materials and patterning the interconnection materials by lithography and dry etching. As the generations advance, however, this technique has found technical limitations. As a new process which takes place the conventional process for forming the interconnections, a technique called the damascene process, in which trench patterns and hole patterns are formed in the inter-layer insulating film, and interconnection materials are buried in the trenches and holes, is being used. The damascene process makes it easy to form the interconnections of low resistance materials, such as copper, etc., which are difficult to etch by reactive ion etching and is very effective to form low resistance interconnections having downsized patterns.

The damascene process contains the single damascene process, in which via-holes and interconnection trenches are buried separately from each other, and the dual damascene processing, in which via-holes and interconnection trenches are buried concurrently with each other. The dual damascene process, in which via-holes and interconnection trenches are buried by one process, has an advantage of making the fabricating method simpler than the single damascene process.

The methods of forming interconnections by the dual damascene process are described in, e.g., Reference 1 (Japanese published unexamined patent application No. 2000-043419) and Reference 2 (Japanese published unexamined patent application No. 2003-197738). The other related arts are disclosed in, e.g., Reference 3 (Japanese published unexamined patent application No. Hei 05-218209).

However, as devices are more downsized, and the via-holes and the interconnection trenches are smaller-sized, the deposition of barrier metal and plating copper film in the via-holes become difficult. Resultantly, filling defects, such as voids, etc., are often made in the interconnections, which lower the interconnection reliability.

SUMMARY OF THE INVENTION

An object of the present invention is to provide a semiconductor device and method for fabricating the same which can facilitate filling interconnection materials in downsized via-holes and interconnection trenches when interconnections are formed by the dual damascene process.

According to one aspect of the present invention, there is provided a method for fabricating a semiconductor device comprising the steps of: sequentially forming over a substrate an insulating film, a first mask, and a second mask whose etching characteristics are different from those of the first mask; removing the first mask and the second mask in a via-hole forming region; anisotropically etching the insulating film in the via-hole forming region down to the middle thereof; removing the second mask in an interconnection trench forming region containing the via-hole forming region; isotropically etching the first mask with the second mask as a mask to expose an upper surface of the insulating film at a periphery of the via-hole forming region and to leave the first mask in the interconnection trench forming region except said periphery; anisotropically etching the first mask and the insulating film with the second mask as a mask to form in the insulating film a via-hole having an increased-width portion at an upper part and an interconnection trench connected to the increased-width portion of the via-hole; and filling an interconnection in the via-hole and the interconnection trench.

According to another aspect of the present invention, there is provided a method for fabricating a semiconductor device comprising the steps of: sequentially forming over a substrate an insulating film, a first mask, a second mask whose etching characteristics are different from those of the first mask, and a third mask whose etching characteristics are different from those of the second mask; removing the first mask, the second mask and the third mask in a via-hole forming region; anisotropically etching the insulating film in the via hole forming region to the middle thereof; removing the third mask in the interconnection trench forming region containing the via-hole forming region; isotropically etching the second mask with the third mask as a mask to expose an upper surface of the first mask at a periphery of the via-hole forming region and to leave the second mask in the interconnection trench forming region except said periphery; anisotropically etching the second mask, the first mask and the insulating film with the third mask as a mask to form in the insulating film a via-hole having an increased-width portion at an upper part, and an interconnection trench connected to the increased-width portion of the via-hole; and filling an interconnection in the via-hole and the interconnection trench.

According to further another aspect of the present invention, there is provided a semiconductor device comprising: an insulating film formed over a substrate and having a via-hole formed down to the substrate and an interconnection trench formed continuous to the via-hole at an upper part thereof; and an interconnection buried in the via-hole and the interconnection trench of the insulating film and formed as a unified part, the via-hole having increased-width portion which is formed on a side of the interconnection trench and have a larger opening diameter than an opening diameter on a side of the substrate.

According to the present invention, the first mask and the second mask in the via-hole forming region is removed, the insulating film in the via-hole forming region is anisotropically etched down to the middle, the second mask in the interconnection trench forming region containing the via-hole forming region is removed, the first mask is isotropically etched with the second mask as a mask so that the upper surface of the insulating film is exposed at the periphery of the via-hole forming region and the first mask in the interconnection trench forming region except the periphery is removed down to the middle, and the first mask and the interconnection film are anisotropically etched with the second mask as a mask. Thus, the via-holes and the interconnection trench are formed in the insulating film. The via-holes having increased-width portions on the side of the interconnection trench can be easily formed, which facilitate the deposition of a barrier metal and Cu film in the via-holes and can suppress the filling defect, such as voids, etc. The reliability of the interconnection can be accordingly increased.

DETAILED DESCRIPTION OF THE PREFERRED EMBODIMENTS

A First Embodiment

Figure 1:
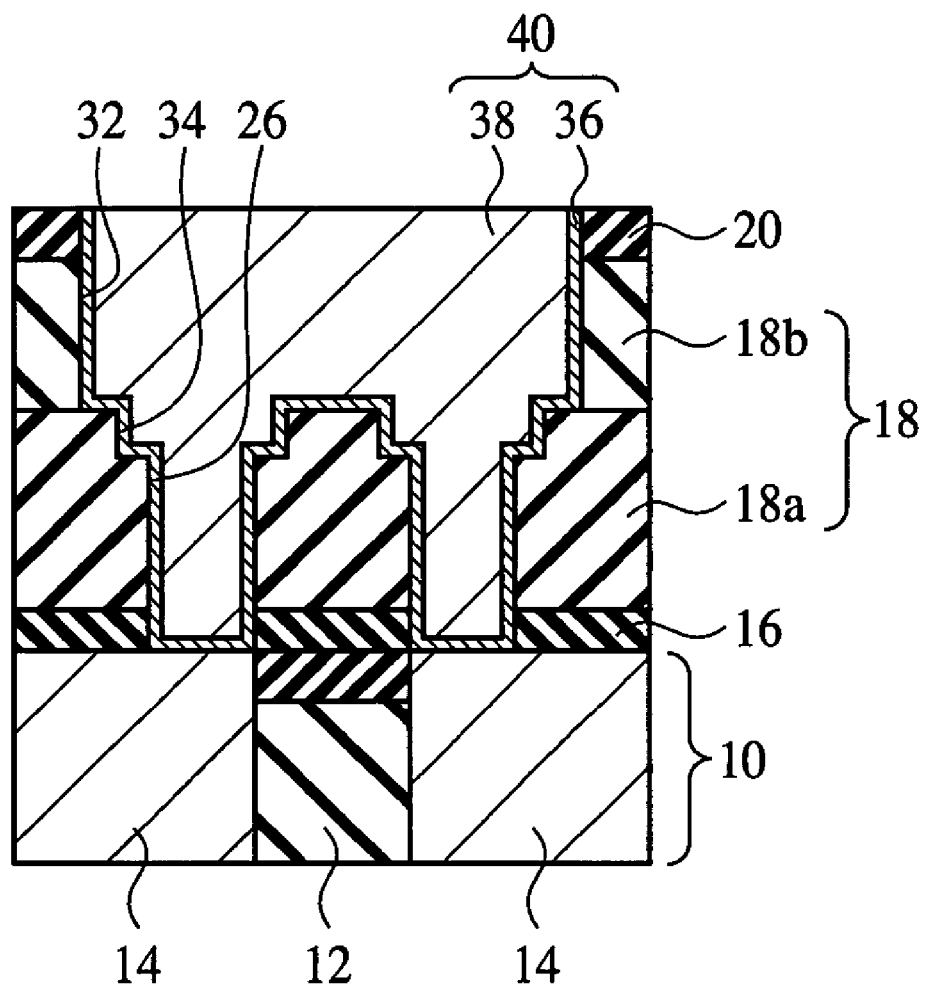
FIG. 1 is a diagrammatic sectional view showing the structure of the semiconductor device according to a first embodiment of the present invention.

The semiconductor device and the method for fabricating the same according to a first embodiment of the present invention will be explained with reference to FIGS. 1 to 8B. FIG. 1 is a diagrammatic sectional view showing the structure of the semiconductor device according to the present embodiment. FIGS. 2A to 8B are sectional views showing the method for fabricating the semiconductor device according to the present embodiment.

First, the structure of the semiconductor device according to the present embodiment will be explained with reference to FIG. 1.

On a substrate 10 having an interconnection 14 buried in an inter-layer insulating film 12, an inter-layer insulating film 18 of a stacked film of a stopper layer 16, an SiOCH film 18a and a porous silica film 18b, and a first hard mask 20 are formed. In the specification of the present application, the substrate 10 includes a semiconductor substrate itself, such as a silicon substrate or others, a semiconductor substrate with elements, such as a transistor or others, formed on, and a semiconductor substrate with one or more interconnection layers formed on them. The interconnection 14 may be a contact plug or an impurity diffused layer.

In the first hard mask 20 and the porous silica film 18b, an interconnection trench 32 is formed. In the SiOCH film 18a and the stopper layer 16, via-holes 26 having increased-width portions 34 on the side of the interconnection trench 32 are formed down to the interconnection 14. In the via-holes 26 and the interconnection trench 32, an interconnection 40 formed of a barrier metal 36 and a Cu film 38 and connected to the interconnection 14 via the via-holes 26 are buried. The interconnection 40 is buried in the inter-layer insulating film 18 by the dual damascene process and has the portion buried in the via-holes 26 and the portion buried in the interconnection trench 32 which are formed as a unified part and are seamless therebetween.

As described above, the semiconductor device according to the present embodiment includes the interconnection 40 buried in the inter-layer insulating film 18 and is characterized in that the increased-width portions 34 are formed in the via-holes 26 connected to the interconnection 14 on the side of the interconnection trench 32. The increased-width portions 34 of the via-holes 26 on the side of the interconnection trench 32 can increase the openings of the via-holes, which facilitates the deposition of the barrier metal 36 and the Cu film 38 in the via-holes 26, whereby the defective filling can be prevented. The reliability of the interconnection can be accordingly increased.

Next, the method for fabricating the semiconductor device according to the present embodiment will be explained with reference to FIGS. 2A to 8B.

First, a 50 nm-thick SiCH film, for example, is deposited by plasma CVD method on the substrate 10 having the interconnection 14 buried in the inter-layer insulating film 12. Thus, the stopper layer 16 of the SiCH film is formed on the substrate 10.

Next, the SiOCH film 18a of, e.g., a 160 nm-thick is formed on the stopper layer 16 by, e.g., plasma CVD method.

Then, a siloxane polymer solution, for example, is applied by spin coating and baked at about 400° C. to form a porous silica film 18b of, e.g., a 140 nm-thick on the SiOCH film 18a.

Thus, on the stopper layer 16, the inter-layer insulating film 18 of low dielectric constant formed of the stacked film of the SiOCH film 18a and the porous silica film 18b is formed.

Figure 2A:
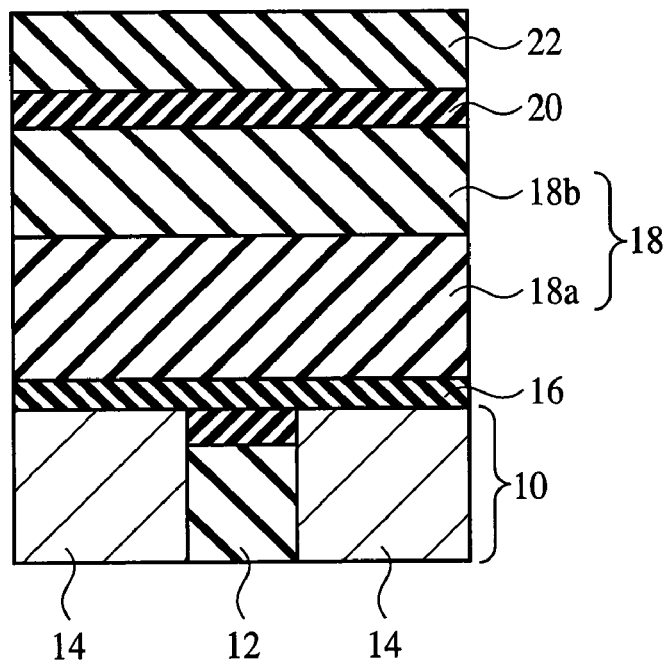
FIGS. 2A-2B, 3A-3B, 4A-4B, 5A-5B, 6A-6B, 7A-7B, and 8A-8B are sectional views showing the method for fabricating the semiconductor device according to the first embodiment of the present invention.

Then, on the inter-layer insulating film 18, a 50 nm-thick SiOCH film and a 100 nm-thick $SiO_2$ film, for example, are grown by, e.g., plasma CVD method. Thus, the first hard mask 20 of the SiOCH film and a second hard mask 22 of the $SiO_2$ film are formed (FIG. 2A).

The "hard mask" is a term which contrasts the mask with the masks of low resistance to the etching gas, such as ArF photoresist, etc. and means a mask whose etching resistance is higher than the masks. When the hard mask is used, usually, a pattern formed in an ArF photoresist or others is transferred to the hard mask, and with the patterned hard mask as the mask, the lower layer structure is processed. In the specification of the present application, the hard mask is often called simply a mask.

The first hard mask 20 is the film used mainly as the mask for forming the via-holes in the inter-layer insulating film 18. The second hard mask is the film used mainly as the mask for forming the interconnection trench. Materials of these hard masks are selected out of the materials which can ensure the etching selectivity with respect to the inter-layer insulating film 18. When the inter-layer insulating film 18 to be etched is formed of mainly an inorganic group insulating material as in the present embodiment, the first and the second hard masks are preferably materials containing carbon (C), such as organic films, carbon film, SiOCH film, etc. The first hard mask 20 and the second hard mask 22 are formed of materials which can mutually ensure the etching selectivity.

Figure 2B:
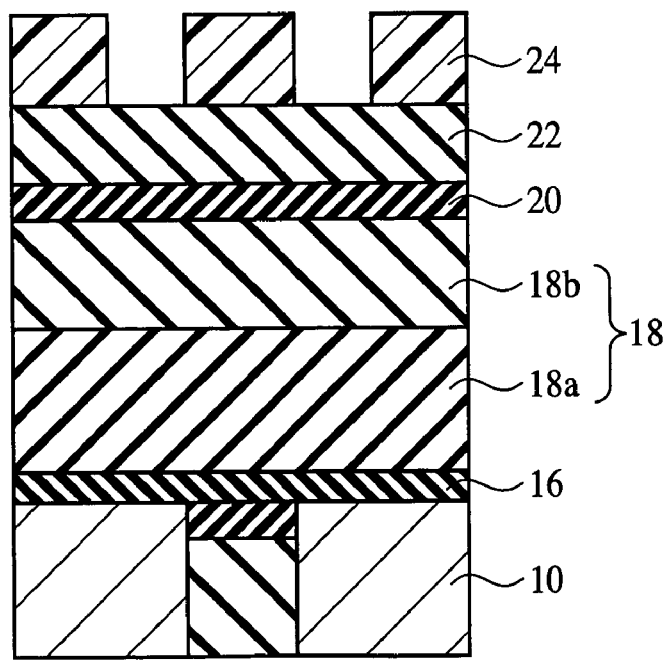

Then, an ArF photoresist film 24 exposing the via-hole forming regions is formed on the second hard mask 22 by photolithography (FIG. 2B). The film thickness of the ArF photoresist film 24 is, e.g., 300 nm, and the opening diameter of the via-hole forming regions is, e.g., 100 nmΦ.

Then, with the ArF photoresist film 24 as the mask, the second hard mask 22, the first hard mask 20, the porous silica film 18b and the SiOCH film 18a are sequentially anisotropically etched to open the via-holes 26 down to the middle of the SiOCH film 18a.

Figure 3A:
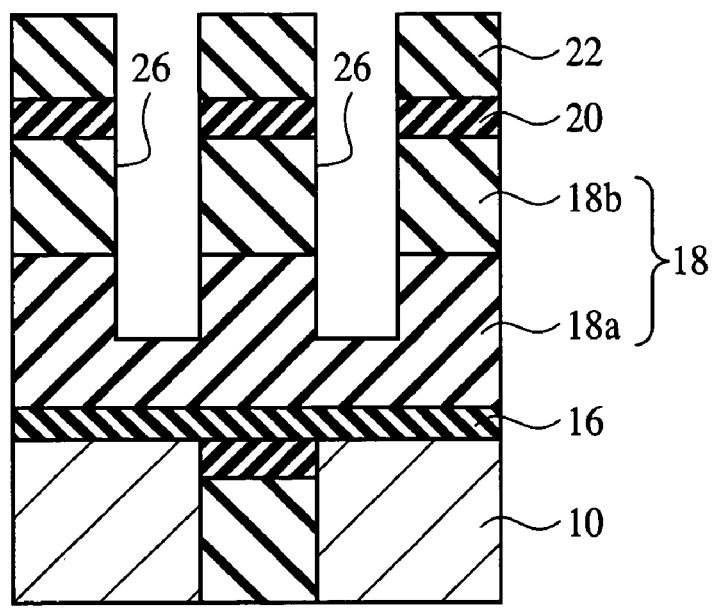

Then, the ArF photoresist film 24 is removed by, e.g., ashing (FIG. 3A).

Next, a 1 μm-thick resin film, for example, is formed by, e.g., spin coating method, and then the resin film is etched back by dry etching using, e.g., oxygen plasmas. Thus, the resin film 28 is buried in the via-holes 26, and the surface is planarized.

Figure 3B:
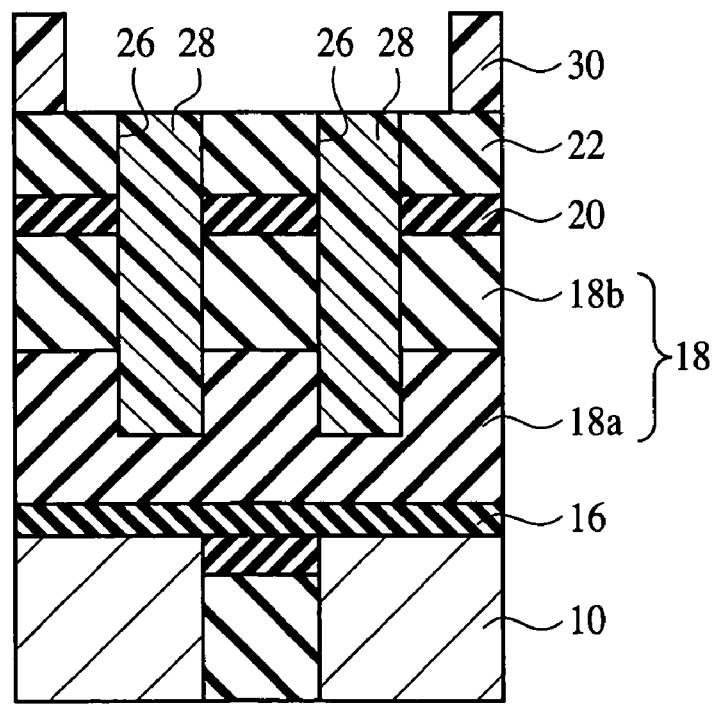

Next, on the second hard mask 22 with the resin film 28 buried in, an ArF photoresist film 30 exposing the interconnection trench forming region is formed (FIG. 3B). The film thickness of the ArF photoresist film 30 is set to, e.g., 300 nm.

Then, with the ArF photoresist film 30 as the mask, and with the first hard mask 20 and the resin film 28 as the stopper, the second hard mask 22 is anisotropically etched to open the interconnection trench 32 down to the first hard mask 20.

Figure 4A:
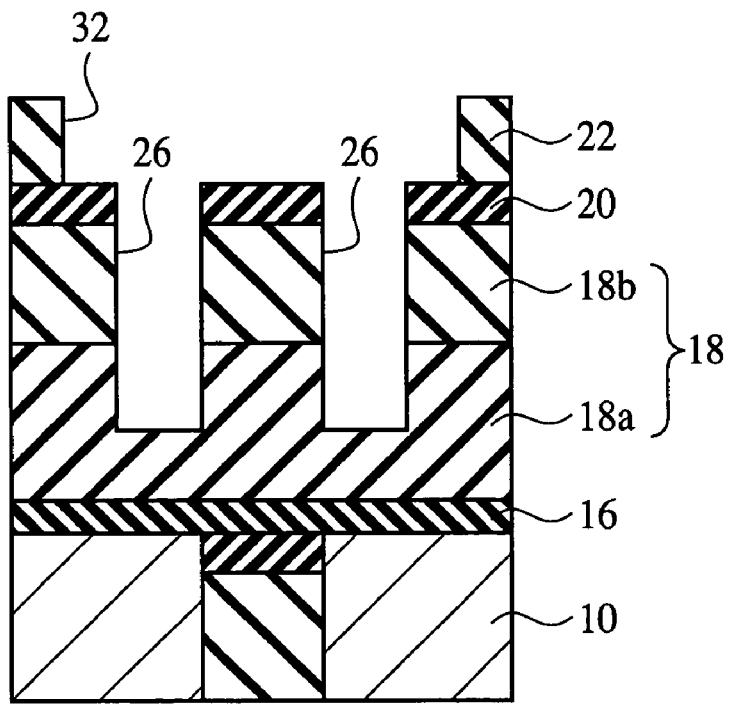

Next, the ArF photoresist film 30 and the resin film 28 are removed by, e.g., ashing (FIG. 4A).

Then, with the second hard mask 22 as the mask, the first hard mask 20 is isotropically etched down to the middle thereof, e.g., by about 20 nm-thick. Conditions for the etching at this time are those which make the etching selectivity of the first hard mask 20 with respect to the porous silica film 18b sufficiently large, e.g., a 300 sccm $H_2$ gas flow rate, a 3 sccm $CF_4$ gas flow rate, a 300 mTorr processing chamber internal pressure and a 100 W power.

The isotropic etching of the first hard mask 20 advances respectively depth-wise from the surface of the first hard mask 20 and horizontally from the side wall of the via-holes 26. Accordingly, when the etching of the first hard mask 20 is paused, the upper surface of the inter-layer insulating film 18 is exposed at the peripheries of the via-holes 26 is exposed, and the thickness of the first hard mask 20 in the interconnection trench 32 except the peripheries of the via-holes 26 is decreased (FIG. 4B).

Next, with the second hard mask 22 as the mask, the first hard mask 20 remaining the in the interconnection trench 32 is anisotropically etched. At this time, the first hard mask 20 is etched under etching conditions which make the etching selectivity of the first hard mask 20 with respect to the inter-layer insulating film 18, at least the porous silica film 18b small. Conditions for the etching are, e.g., a 30 sccm $CHF_3$ gas flow rate, a 5 sccm $O_2$ gas flow rate, a 15 sccm $N_2$ gas flow rate, a 15 mTorr processing chamber internal pressure and a 200 W power.

Figure 5A:
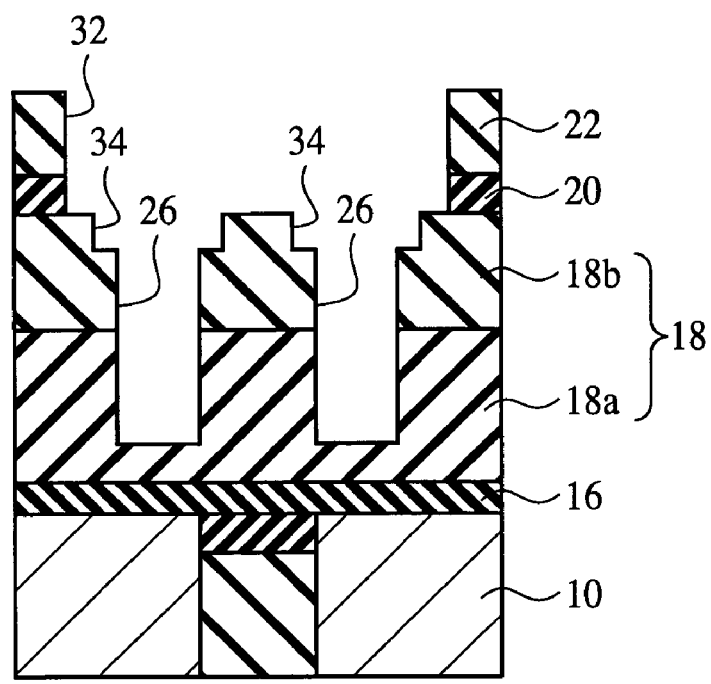
Figure 5B:
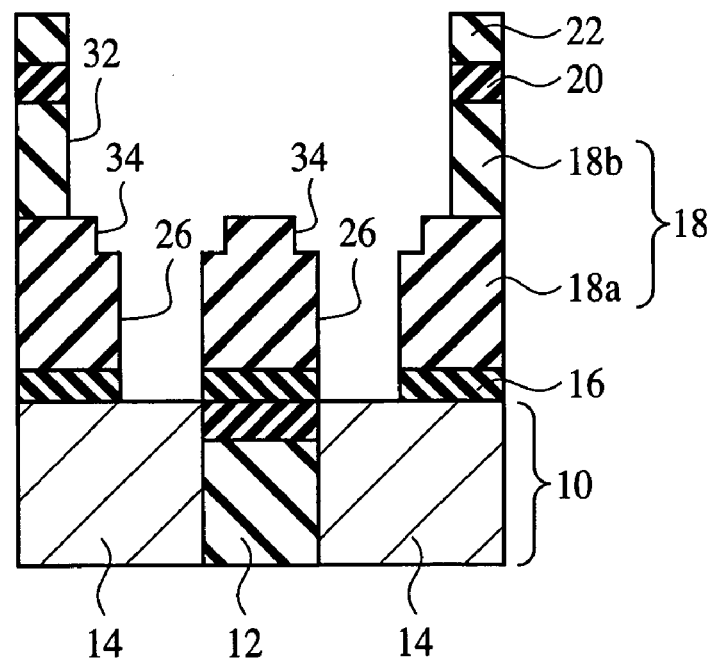

Thus, the interconnection trench 32 is opened down to the inter-layer insulating film 18. At the peripheries of the via-holes 26, where the first hard mask 20 is not formed, the porous silica film 18b is etched. Thus, at the peripheries of the via-holes 26 on the side of the surface of the porous silica film 18b, the increased-width portions 34 reflecting the configurations of the first hard mask 20 before the etching are formed (FIG. 5A). The opening diameter of the increased-width portions 34 is, e.g., about 140 nm.

Figure 4B:
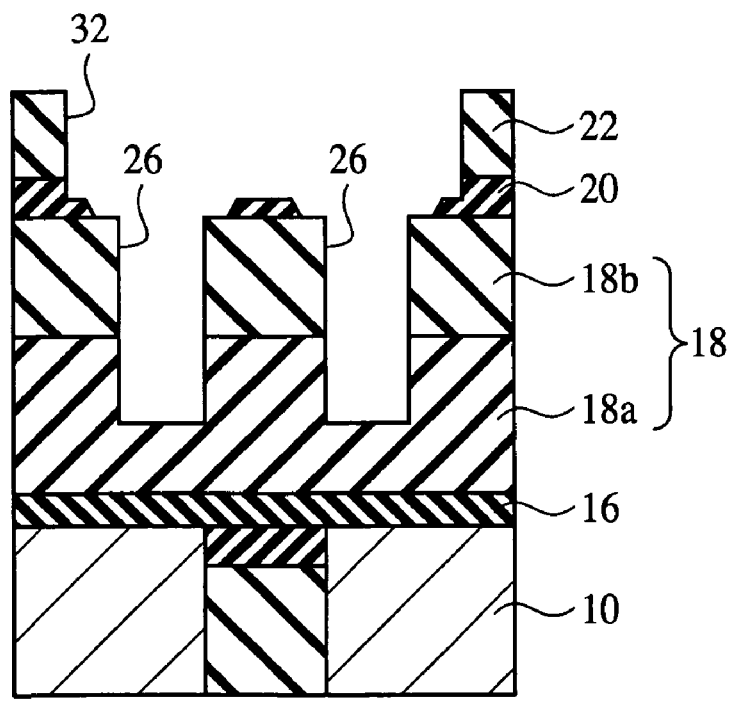

The configuration of the increased-width portions of the via-holes 26 can be controlled by changing the combination of the isotropic etching amount in the step of FIG. 4B and the anisotropic etching amount in the step of FIG. 5A.

Figure 7A:
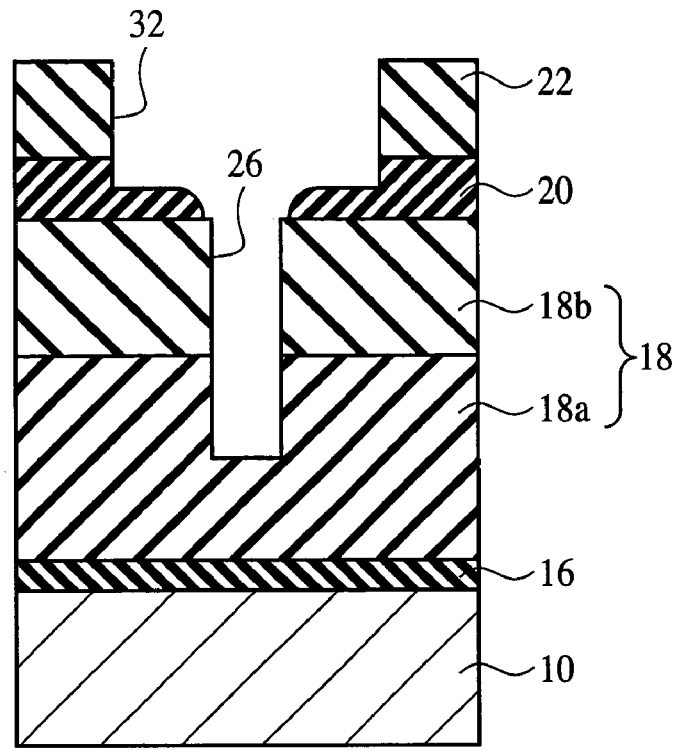
Figure 7B:
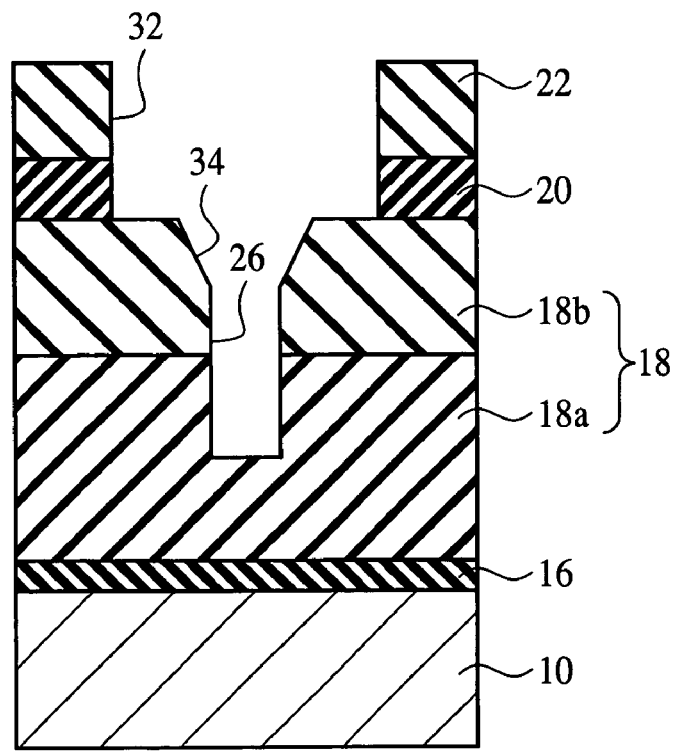
Figure 8A:
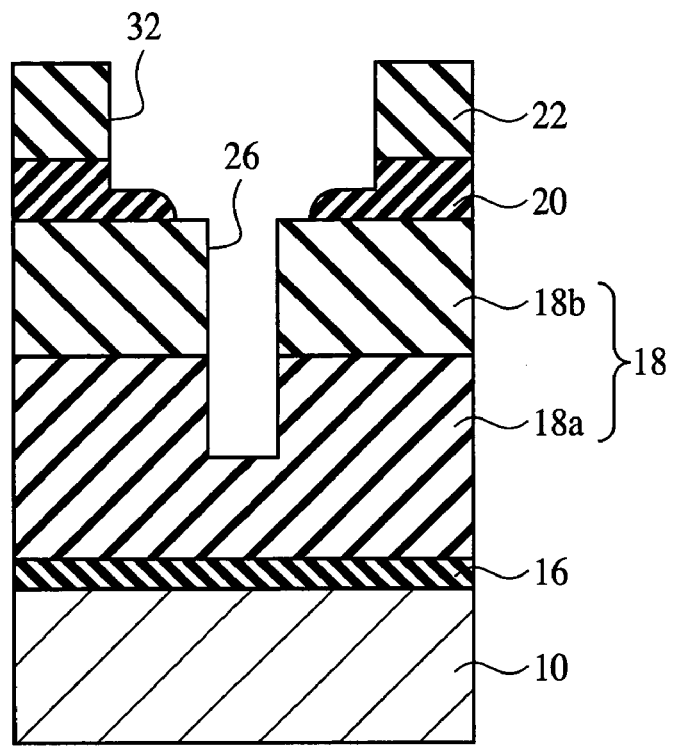
Figure 8B:
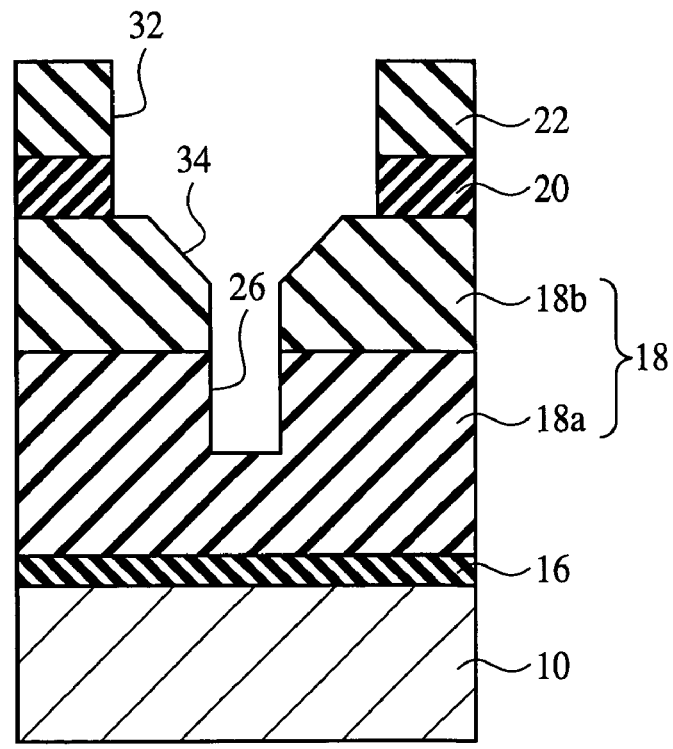

That is, when the isotropic etching amount in the step of FIG. 4B is small, the width-wise etching amount of the first hard mask is small (FIG. 7A), and the width of the increased-width portions formed by the isotropic etching in the step of FIG. 5A becomes small (FIG. 7B). That is, the upper taper angle of the via-holes 26 becomes small. On the other hand, when the isotropic etching amount in the step of FIG. 4A is large, the width-wise etching amount of the first hard mask becomes large (FIG. 8A), and the width of the increased-width portions formed by the isotropic etching in the step of FIG. 5A becomes large (FIG. 8B). That is, the upper taper angle of the via-holes 26 becomes large.

The increased-width portions 34 are formed with the second hard mask 22 as the mask and can be prohibited from increasing beyond the interconnection trench forming region. Thus, when interconnections are formed adjacent to each other, the short circuit between the interconnections can be prevented.

Next, with the second hard mask 22 as the mask, the porous silica film 18b, the SiOCH film 18a and the stopper layer 16 are anisotropically etched to deepen the via-holes 26 and the interconnection trench 32. Conditions for the etching are, e.g., a 100 sccm $CF_4$ gas flow rate, a 50 sccm $CHF_3$ gas flow rate, a 200 mTorr processing chamber internal pressure and a 500 W power.

Thus, the interconnection trench 32 is opened down to the SiOCH film 18a. In the porous silica film 18a and the stopper layer 16, the via-holes 26 having the increased-width portions 34 on the side of the interconnection trench 32 and arriving at the interconnection 14 are formed (FIG. 5A).

Figure 6A:
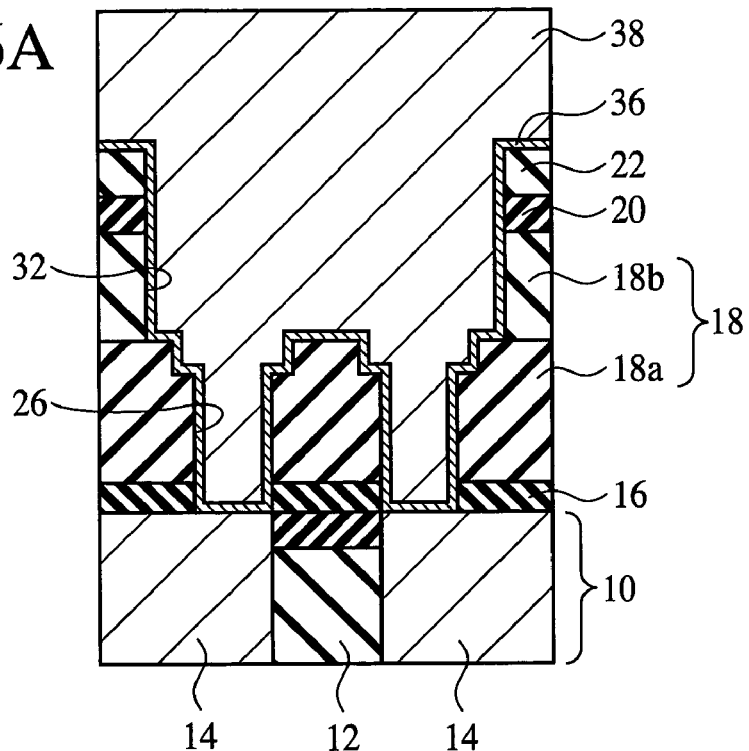

Then, a barrier metal and a Cu seed are formed by sputtering method, and Cu plating is made. Thus, the via-holes 26 and the interconnection trench 32 are filled with the barrier metal 36 and the Cu film 38 (FIG. 6A).

Figure 6B:
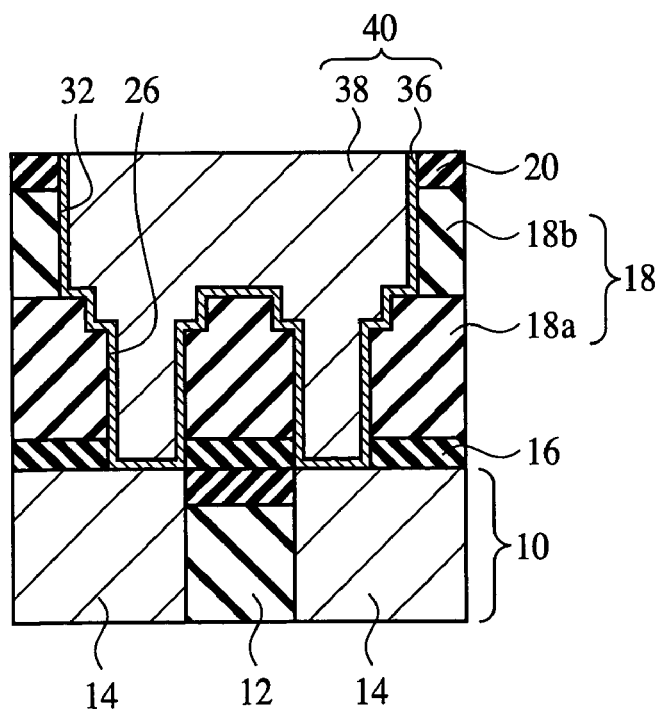

Next, the Cu film 38, the barrier metal 36 and the second hard mask 22 are polished by CMP (Chemical Mechanical Polishing) method until the first hard mask 20 is exposed to leave the Cu film 38 and the barrier metal 36 selectively in the via-holes 26 and the interconnection trench 32. Thus, in the via-holes 26 and the interconnection trench 32, the interconnection 40 formed of the barrier metal 36 and the Cu film 38 and connected to the interconnection 14 is formed(FIG. 6B).

Next, the upper level interconnection layers are repeatedly formed as required to thereby complete the semiconductor device.

As described above, according to the present embodiment, when the interconnection is formed by the dual damascene process, the first hard mask used in mainly forming the via-holes is isotropically etched under conditions for making the etching selectivity with respect to the inter-layer insulating film sufficiently large and then anisotropically etched under conditions for making the etching selectivity with respect to the inter-layer insulating film sufficient small, to remove the first hard mask in the interconnection trench forming region, whereby the via-holes having the increased-width portions can be formed on the side of the interconnection trench. This facilitates the deposition of the barrier metal and the Cu film in the via-holes, and the defective filling, such as voids, etc. can be suppressed. Accordingly, the reliability of the interconnections can be improved.

A Second Embodiment

The method for fabricating the semiconductor device according to a second embodiment of the present invention will be explained with reference to FIGS. 9A to 13B. FIGS. 9A to 13B are sectional views showing the method for fabricating the semiconductor device according to the present embodiment. The same members of the present embodiment as those of the semiconductor device and the method for fabricating the semiconductor device according to the first embodiment shown in FIGS. 1 to 8B are represented by the same reference numbers not to repeat or to simplify their explanation.

In the first embodiment described above, the hard mask of the 2-layer structure is used. In the method for fabricating the semiconductor device according to the present embodiment, the via-holes and the interconnection trench are formed by using a hard mask of a 3-layer structure.

First, on a substrate 10, a 50 nm-thick SiCH film, for example, is deposited by, e.g., plasma CVD method. Thus, a stopper layer 16 of the SiCH film is formed on the substrate 10.

Nest, an SiOCH film 18a of, e.g., a 160 nm-thick is formed on the stopper layer 16 by, e.g., plasma CVD method.

Then, a siloxane polymer solution, for example, is applied by spin coating and baked at about 400° C. to form a porous silica film 18b of, e.g., a 140 nm-thick on the SiOCH film 18a.

Thus, on the stopper layer 16, an inter-layer insulating film 18 of low dielectric constant formed of the stacked film of the SiOCH film 18a and the porous silica film 18b is formed.

Figure 9A:
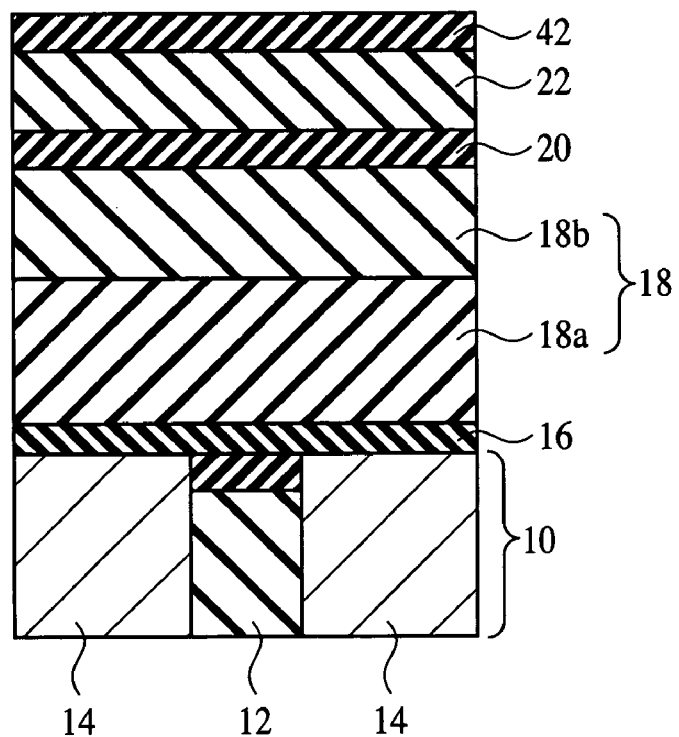
FIGS. 9A-9B, 10A-10B, 11A-11B, 12A-12B, and 13A-13B are sectional views showing the method for fabricating the semiconductor device according to a second embodiment of the present invention.

Then, on the inter-layer insulating film 18, a 50 nm-thick SiOCH film, for example, a 100 nm-thick $SiO_2$ film, for example, and a 70 nm-thick SiCH film, for example, are grown. Thus, a first hard mask 20 of the SiOCH film, a second hard mask 22 of the $SiO_2$ film and a third hard mask 42 of the SiCH film are formed (FIG. 9A).

The first hard mask 20 is a film used as the mask mainly in forming via-holes in the inter-layer insulating film 18. The second hard mask is a film used as the mask mainly in forming an interconnection trench in the inter-layer insulating film 18. The constituent materials forming these hard masks are selected out of materials which can ensure the etching selectivity with respect to the inter-layer insulating film 18. The first hard mask 20 and the second hard mask 22, and the second hard mask 22 and the third hard mask are formed of materials which can mutually the etching selectivity.

Figure 9B:
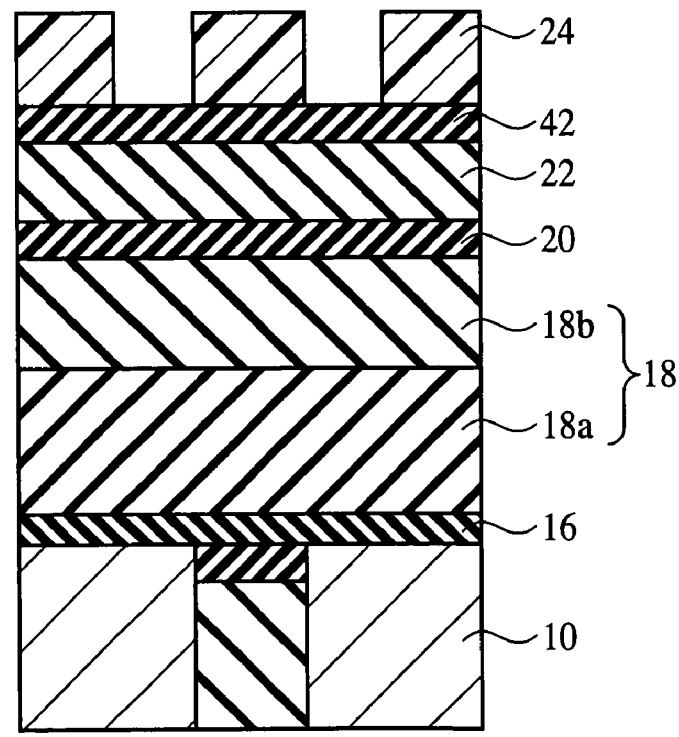

Then, an ArF photoresist film 24 exposing via-hole forming regions are formed on the third hard mask 42 by photolithography (FIG. 9B). The film thickness of the ArF photoresist film 24 is, e.g., 300 nm, and the opening diameter of the via-hole forming regions is, e.g., 100 nmΦ.

Then, with the ArF photoresist film 24 as the mask, the third hard mask 42, the second hard mask 22, the first hard mask 20, the porous silica film 18b and the SiOCH film 18a are sequentially anisotropically etched to open the via-holes 26 down to the middle of the SiOCH film 18a.

Figure 10A:
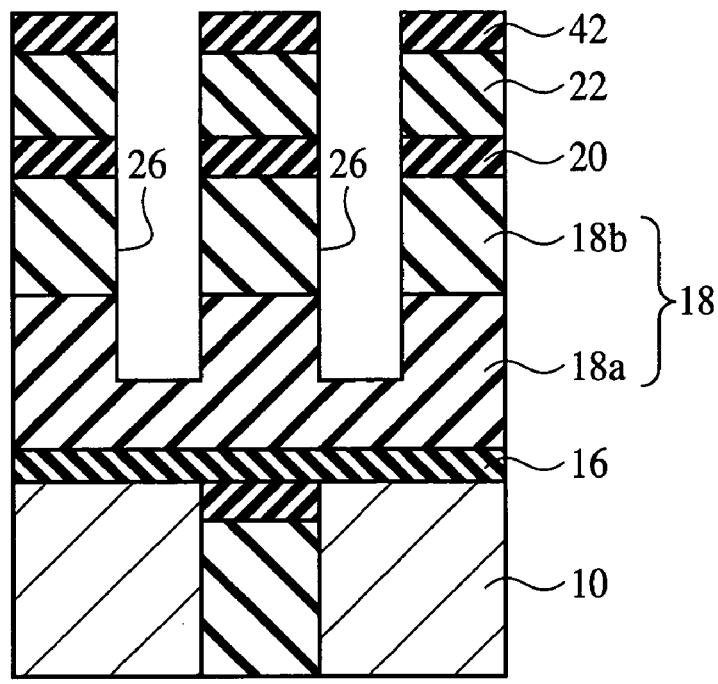

Then, the ArF photoresist film 24 is removed by, e.g., ashing (FIG. 10A).

Then, a 1 μm-thick resin film is formed by, e.g., spin coating method, and the resin film is etched back by dry etching using, e.g., oxygen plasmas. Thus, the resin film 28 is buried in the via-holes 26, and the surface is planarized.

Figure 10B:
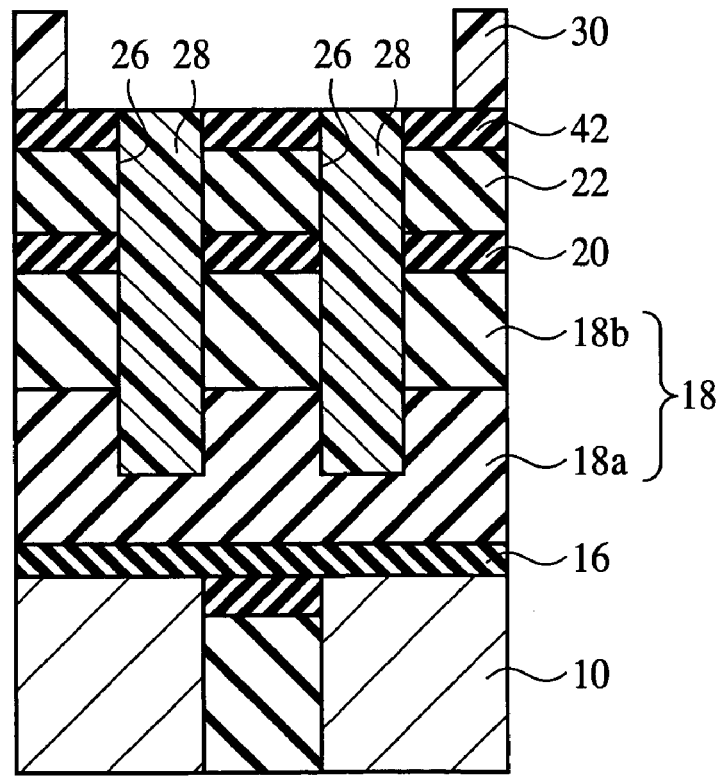

Then, on the third hard mask 42 with the resin film 28 buried in, an ArF photoresist film 30 exposing the interconnection trench forming region is formed by photolithography (FIG. 10B). The film thickness of the ArF photoresist film 30 is set to, e.g., 300 nm.

Next, with the ArF photoresist film 30 as the mask and with the second hard mask 22 and the resin film 28 as the stopper, the third hard mask 42 is anisotropically etched to open the interconnection trench 32 down to the second hard mask 22.

Figure 11A:
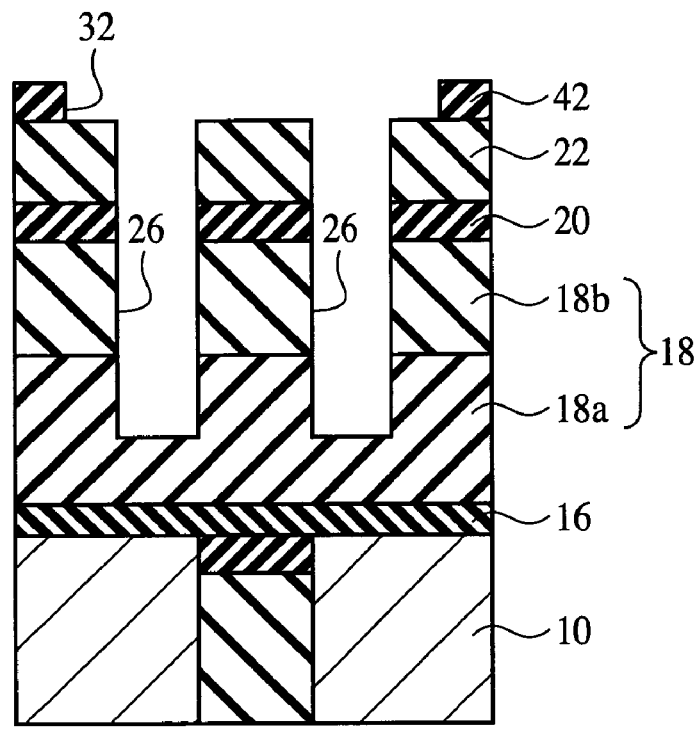

Then, the ArF photoresist film 30 and the resin film 28 are removed by, e.g., ashing (FIG. 11A).

Figure 11B:
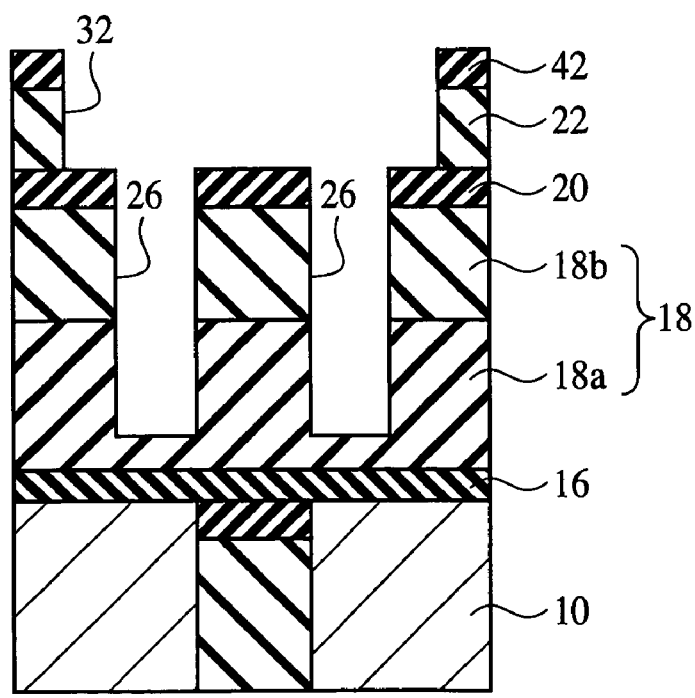

Next, with the third hard mask as the mask and with the first hard mask 20 as the stopper, the second hard mask 22 is anisotropically etched to open the interconnection trench 32 down to the first hard mask 22 (FIG. 11B).

Then, with the second hard mask 22 as the mask, the first hard mask 20 is isotropically etched down to the middle thereof, e.g., by about 20 nm-thick. Conditions for the etching at this time are those which make the etching selectivity of the first hard mask 20 with respect to the porous silica film 18b sufficiently large, e.g., a 300 sccm $H_2$ gas flow rate, a 3 sccm $CF_4$ gas flow rate, a 300 mTorr processing chamber internal pressure and a 100 W power.

Figure 12A:
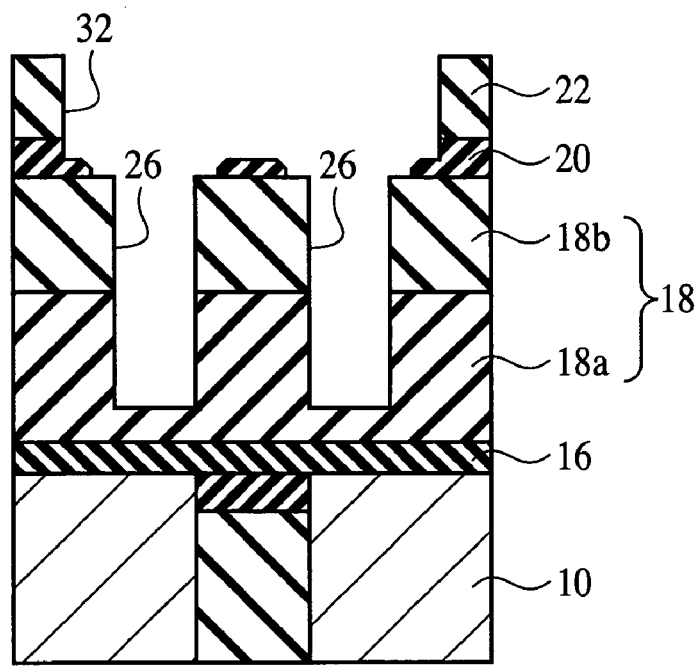

The isotropic etching of the first hard mask 20 advances respectively depth-wise from the surface of the first hard mask 20 and horizontally from the side wall of the via-holes 26. Accordingly, when the etching of the first hard mask 20 is paused, the upper surface of the inter-layer insulating film 18 is exposed at the peripheries of the via-holes 26 is exposed, and the thickness of the first hard mask 20 in the interconnection trench 32 except the peripheries of the via-holes 26 is decreased (FIG. 12A).

Next, with the second hard mask 22 as the mask, the first hard mask 20 remaining in the interconnection trench 32 is anisotropically etched. At this time, the first hard mask 20 is etched under etching conditions which make the etching selectivity of the first hard mask 20 with respect to the inter-layer insulating film 18, at least the porous silica film 18b small. Conditions for the etching are, e.g., a 30 sccm $CHF_3$ gas flow rate, a 5 sccm $O_2$ gas flow rate, a 15 sccm $N_2$ gas flow rate, a 15 mTorr processing chamber internal pressure and a 200 W power.

Figure 12B:
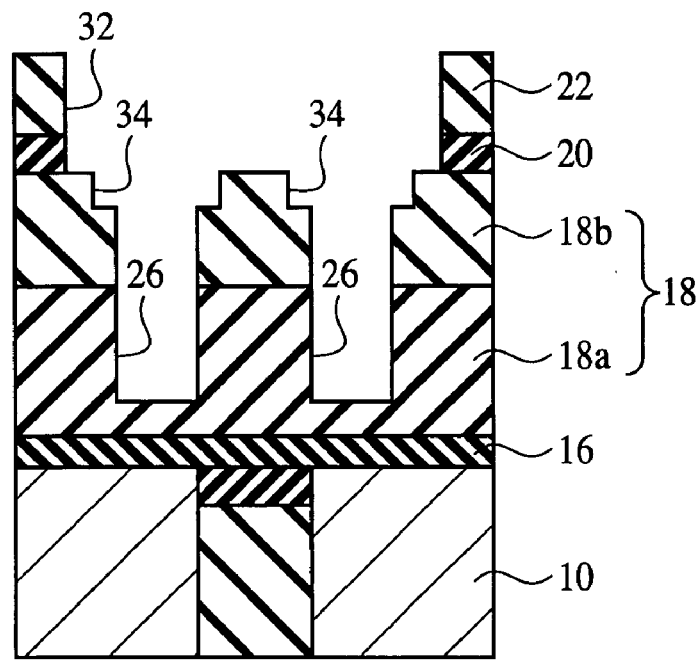

Thus, the interconnection trench 32 is opened down to the inter-layer insulating film 18. At the peripheries of the via-holes 26, where the first hard mask 20 is not formed, the porous silica film 18b is etched. Thus, at the peripheries of the via-holes 26 on the side of the surface of the porous silica film 18b, the increased-width portions 34 reflecting the configurations of the first hard mask 20 before the etching are formed (FIG. 12B). The opening diameter of the increased-width portions 34 is, e.g., about 140 nm.

Then, with the second hard mask 22 as the mask, the porous silica film 18b, the SiOCH film 18a and the stopper layer 16 are anisotropically etched to deepen the via-holes 26 and the interconnection trench 32. Etching conditions are, e.g., a 100 sccm $CF_4$ gas flow rate, a 50 sccm $CHF_3$ gas flow rate, 200 mTorr processing chamber internal pressure and a 500 W power.

Figure 13A:
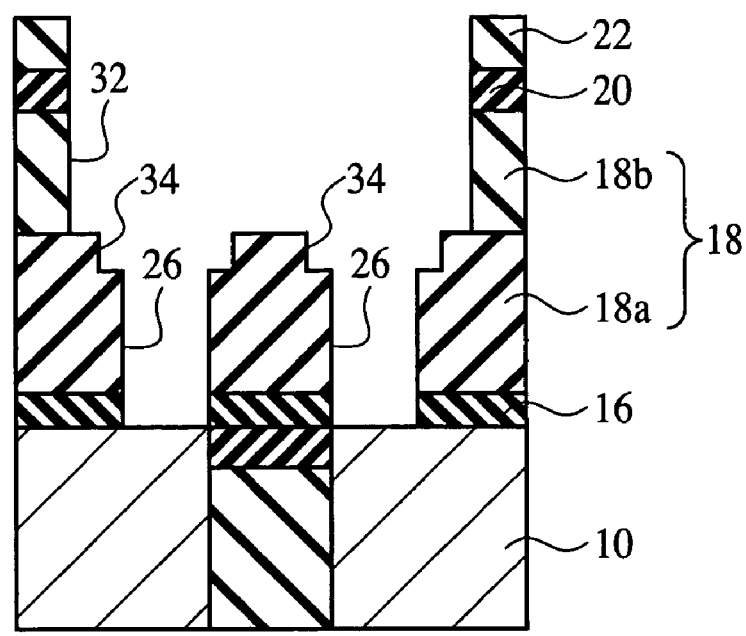
Figure 13B:
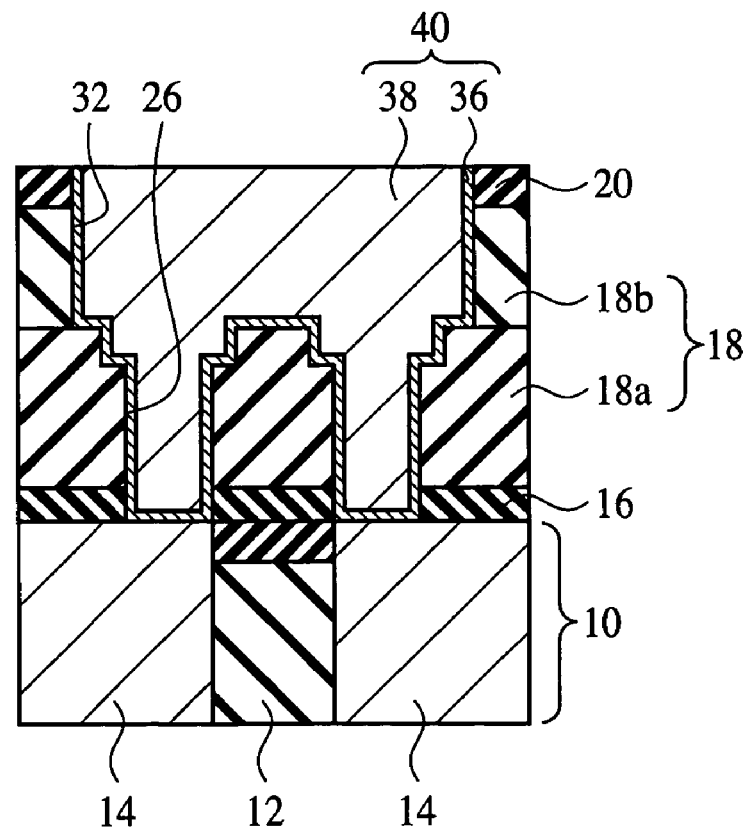

Thus, the interconnection trench 32 is opened down to the SiOCH film 18a. In the SiOCH film 18a and the stopper layer 16, the via-holes 26 having the increased-width portions 34 on the side of the interconnection trench 32 are formed down to the interconnection 14 (FIG. 13A).

Next, a barrier metal and a Cu seed are formed by sputtering method, and Cu plating is made. Thus, the via-holes 26 and the interconnection trench 32 are filled with the barrier metal 36 and the Cu film 38.

Then, the Cu film 38, the barrier metal 36 and the second hard mask 22 are polished by CMP method until the first hard mask 20 is exposed to leave the Cu film 38 and the barrier metal 36 selectively in the via-holes and the interconnection trench 32. Thus, in the via-holes 26 and the interconnection trench 32, an interconnection 40 formed of the barrier metal 36 and the Cu film 38 and connected to the interconnection 14 is formed (FIG. 12B).

As described above, according to the present embodiment, when the interconnection is formed by the dual damascene process, the first hard mask used in mainly forming the via-holes is isotropically etched under conditions for making the etching selectivity with respect to the inter-layer insulating film sufficiently large and then anisotropically etched under conditions for making the etching selectivity with respect to the inter-layer insulating film sufficient small, to remove the first hard mask in the interconnection trench forming region, whereby the via-holes having the increased-width portions can be formed on the side of the interconnection trench. This facilitates the deposition of the barrier metal and the Cu film in the via-holes, and the defective filling, such as voids, etc. can be suppressed. Accordingly, the reliability of the interconnections can be improved.

A Third Embodiment

The method for fabricating the semiconductor device according to a third embodiment of the present invention will be explained with reference to FIGS. 14A to 16C. FIGS. 14A to 16C are sectional views showing the method for fabricating the semiconductor device according to the present embodiment. The same members of the present embodiment as those of the semiconductor device and the method for fabricating the same according to the first and the second embodiments shown in FIGS. 1 to 13B are represented by the same reference number not to repeat or to simplify their explanation.

In the present embodiment, via-holes and an interconnection trench are formed by using a 3-layer structure hard mask.

Figure 14A:
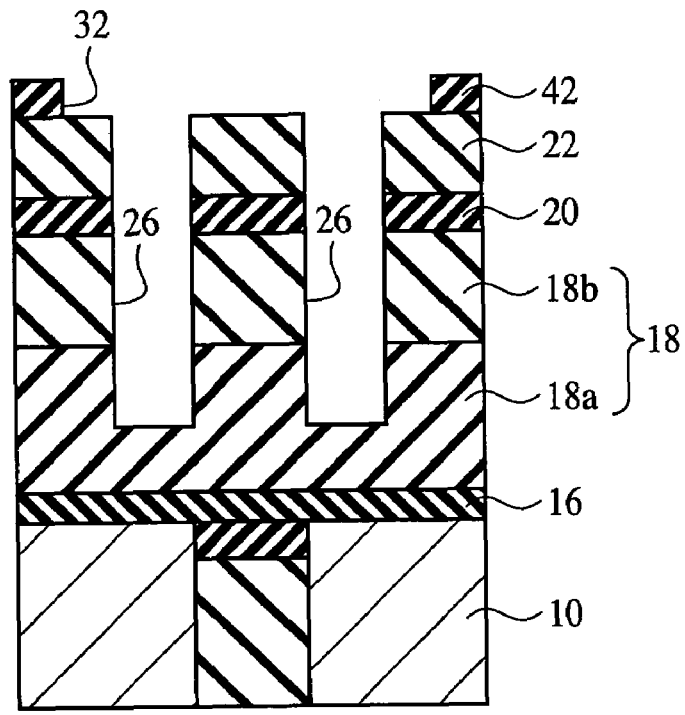
FIGS. 14A-14B, 15A-15B, and 16A-16B are sectional views showing the method for fabricating the semiconductor device according to a third embodiment of the present invention.

First, in the same way as in the method for fabricating the semiconductor device according to the second embodiment as exemplified in FIGS. 9A to 11A, a first hard mask 20, a second hard mask 22 and a third hard mask 42 are formed on an inter-layer insulating film 18, and then the via-holes 26 and the interconnection trench 32 are formed respectively down to the middle of the inter-layer insulating film 18 and down to the second hard mask 22 (FIG. 14A).

The first hard mask 20 is a film used as the mask mainly in forming the via-holes in the inter-layer insulating film 18. The second hard mask is a film used as the mask mainly in forming the interconnection trench in the inter-layer insulating film 18. The constituent materials of these hard masks are selected out of materials which can ensure the etching selectivity with respect to the inter-layer insulating film 18. The first hard mask 20 and the second hard mask 22, and the second hard mask and the third hard mask are formed of materials which can mutually ensure the etching selectivity.

Then, with the third hard mask 42 as the mask and with the first hard mask 20 as the stopper, the second hard mask 22 is isotropically etched. Etching conditions at this time are those which make the etching selectivity of the second hard mask 22 with respect to the first hard mask 22 sufficiently large, e.g., a 50 sccm $C_4F_6$ gas flow rate, a 20 sccm $O_2$ gas flow rate, a 300 sccm Ar gas flow rate, a 200 mTorr processing chamber internal pressure and a 500 W power.

Figure 14B:
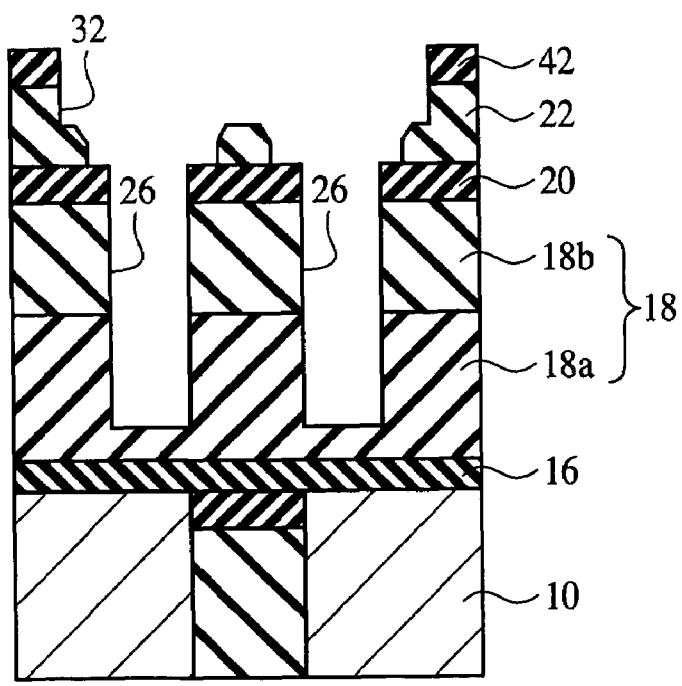

The isotropic etching of the second hard mask 22 advances respectively depth-wise from the surface of the second hard mask 22 and horizontally from the side walls of the via-holes 26. Accordingly, when the etching of the second hard mask 22 paused, the upper surface of the first hard mask 20 is exposed at the peripheries of the via-holes 26, and the film thickness of the second hard mask 22 in the interconnection trench 32 except the peripheries of the via-holes 26 is decreased (FIG. 14B).

Then, with the second hard mask 22 as the mask and with the inter-layer insulating film 18 as the stopper, the first hard mask 20 is anisotropically etched. Etching conditions at this time are those which make the etching selectivity of the second hard mask 22 with respect to the first hard mask 22 small, e.g., a 30 sccm $CH_2F_2$ gas flow rate, a 10 sccm $O_2$ gas flow rate, a 100 sccm $N_2$ gas flow rate, a 20 mTorr processing chamber internal pressure and a 200 W power.

Figure 15A:
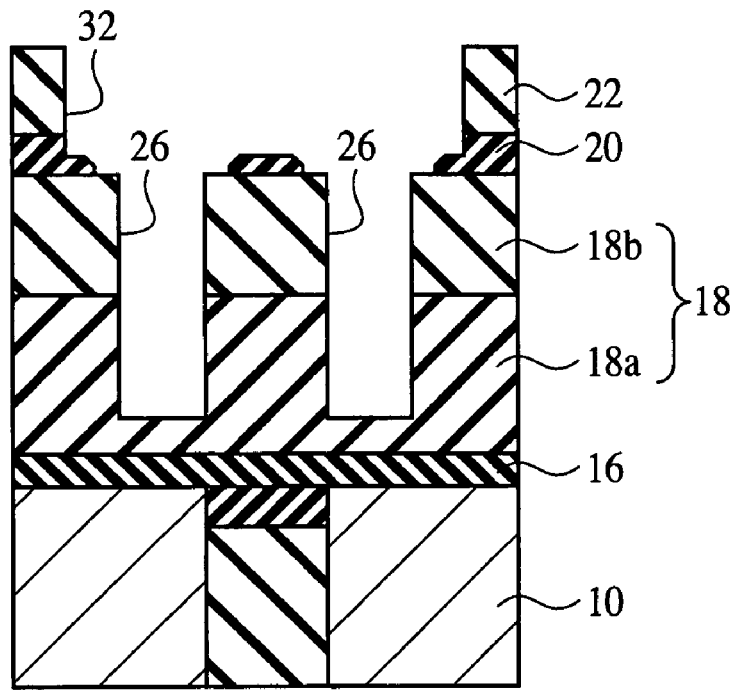

The etching amount of the first hard mask 20 in this step is about the film thickness of the first hard mask 20, and the etching is stopped when the inter-layer insulating film 18 at the peripheries of the via-holes 26 is exposed. Thus, the first hard mask 20 at the peripheries of the via-holes 26 is removed, the upper surface of the inter-layer insulating film 18 at the peripheries of the via-holes 26 is exposed, and the film thickness of the first hard mask 20 in the interconnection trench 32 except the peripheries of the via-holes 26 is decreased (FIG. 15A).

Then, with the second hard mask 22 as the mask, the first hard mask 20 remaining in the interconnection trench 32 is anisotropically etched. At this time, the first hard mask 20 is etched under etching conditions which make the etching selectivity of the first hard mask 20 with respect to the inter-layer insulating film, at least the porous silica film 18b small. Etching conditions are, e.g., a 30 sccm $CHF_3$ gas flow rate, a 5 sccm $O_2$ gas flow rate, a 15 sccm $N_2$ gas flow rate, a 15 mTorr processing chamber internal pressure and a 200 W power.

Figure 15B:
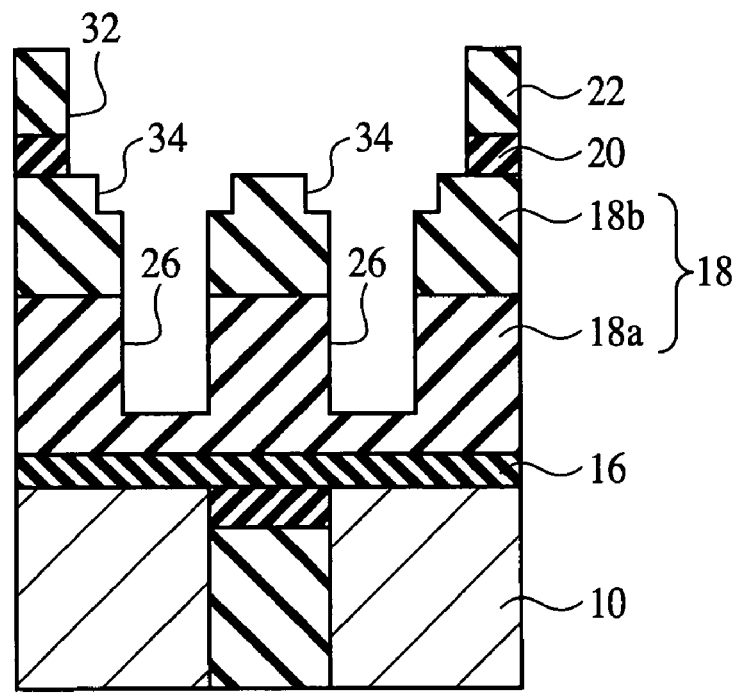

Thus, the interconnection trench 32 is opened down to the inter-layer insulating film 18. At the peripheries of the via-holes 26, where the first hard mask 20 is not formed, the porous silica film 18b is etched. Thus, at the peripheries of the via-holes 26 on the side of the surface of the porous silica film 18b, the increased-width portions 34 as shown, which reflect the configuration of the first hard mask 20 before etched are formed (FIG. 15B). The opening diameter of the increased-width portions 34 is about, e.g., 140 nm.

Then, with the second hard mask 22 as the mask, the porous silica film 18b, the SiOCH film 18a and the stopper layer 16 are anisotropically etched to deepen the via-holes 26 and the interconnection trench 32. Etching conditions are, e.g., a 100 sccm $CF_4$ gas flow rate, a 50 sccm $CHF_3$ gas flow rate, a 200 mTorr processing chamber internal pressure and a 500 W power.

Figure 16A:
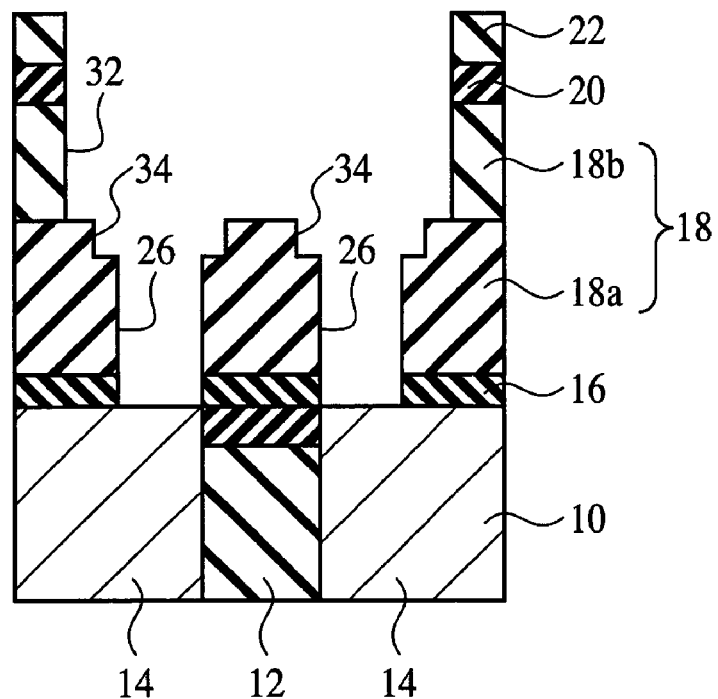

Thus, the interconnection trench 32 is opened down to the SiOCH film 18a. In the SiOCH film 18a and the stopper layer 16, the via-holes 26 having the increased-width portions 34 on the side of the interconnection trench 32 are formed down to the interconnection 14 (FIG. 16A).

Next, a barrier metal and a Cu seed are formed by sputtering method, and Cu plating is made. Thus, the via-holes 26 and the interconnection trench 32 are filled with the barrier metal 36 and the Cu film 38.

Figure 16B:
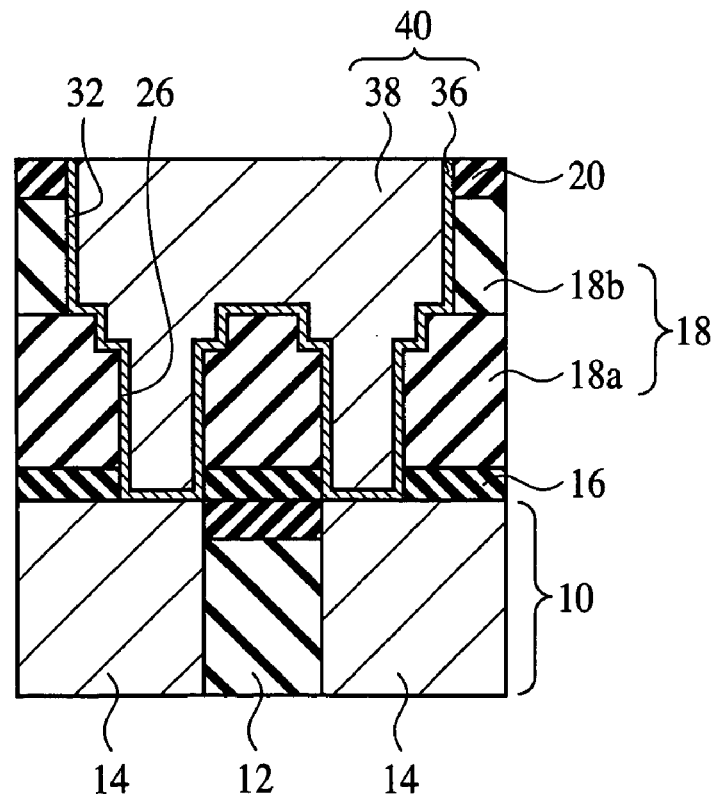

Then, the Cu film 38, the barrier metal 36 and the second hard mask 22 are polished by CMP method until the first hard mask 20 is exposed to leave the Cu film 38 and the barrier metal 36 selectively in the via-holes and the interconnection trench 32. Thus, in the via-holes 26 and the interconnection trench 32, an interconnection 40 formed of the barrier metal 36 and the Cu film 38 and connected to the interconnection 14 is formed (FIG. 16B).

As described above, according to the present embodiment, when the interconnection is formed by the dual damascene process, the second hard mask used in mainly forming the interconnection trench is isotropically etched under conditions for making the etching selectivity with respect to the first hard mask used mainly in forming the via-holes sufficiently large, then anisotropically etched under conditions for making the etching selectivity with respect to the first hard mask small, to remove the second hard mask in the interconnection trench forming region, and then the first hard mask in the interconnection trench is anisotropically etched off under conditions which make the first hard mask with respect to the inter-layer insulating film small, whereby the via-holes having the increased-width portions can be formed on the side of the interconnection trench. This facilitates the deposition of the barrier metal and the Cu film in the via-holes, and the defective filling, such as voids, etc. can be suppressed. Accordingly, the reliability of the interconnections can be improved.

A Fourth Embodiment

Figure 17:
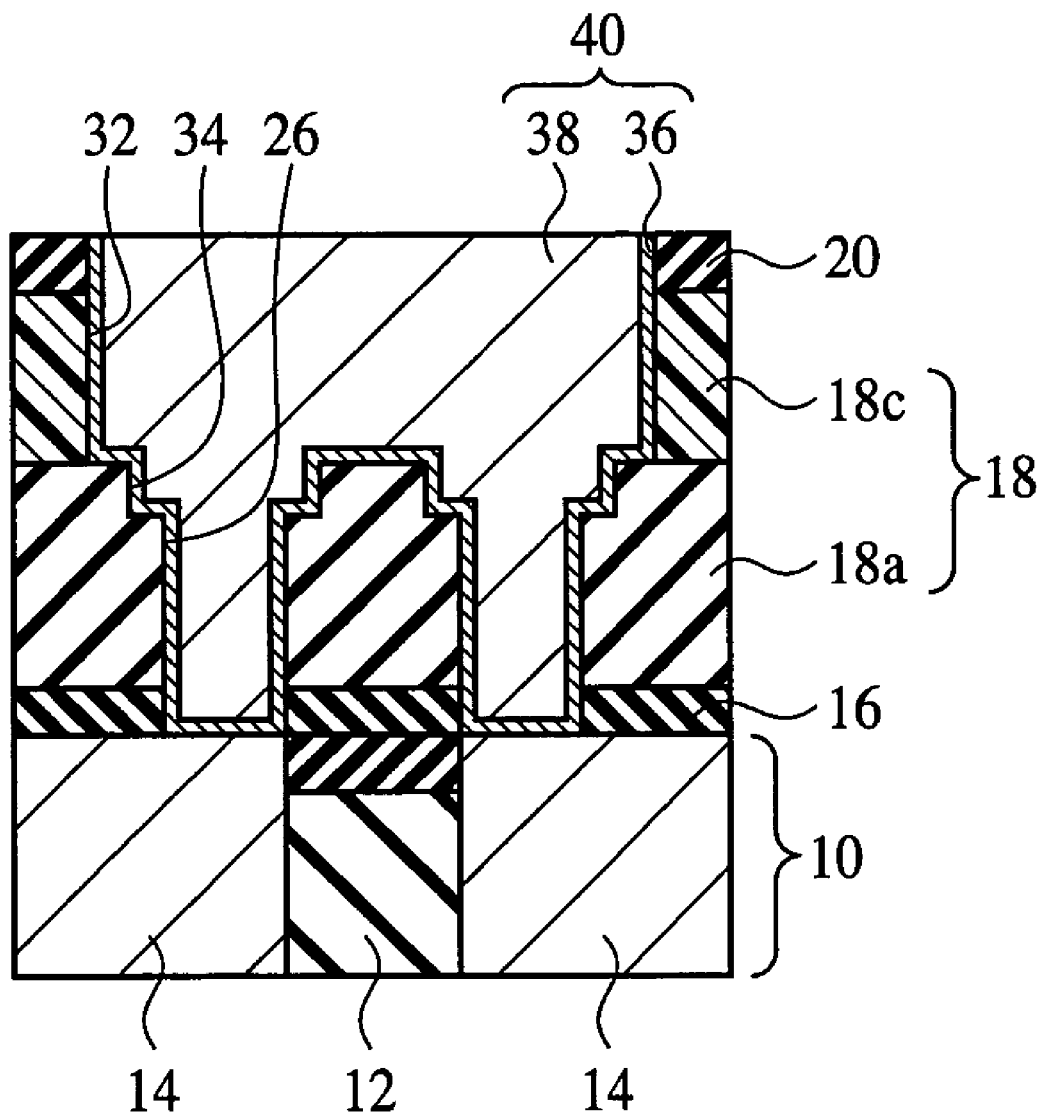
FIG. 17 is a diagrammatic sectional view showing the structure of the semiconductor device according to a fourth embodiment of the present invention.

The semiconductor device and the method for fabricating the same according to a fourth embodiment of the present invention will be explained with reference to FIGS. 17 to 24B. FIG. 17 is a diagrammatic sectional view showing the structure of the semiconductor device according to the present embodiment. FIGS. 18A to 24B are sectional views showing the method for fabricating the semiconductor device according to the present embodiment. The same members of the present embodiment as those of the semiconductor device and the method for fabricating the same according to the first to the third embodiments shown in FIGS. 1 to 16B are represented by the same reference numbers not to repeat or to simplify their explanation.

First, the structure of the semiconductor device according to the present embodiment will be explained with reference to FIG. 17.

On a substrate 10 having an interconnection 14 buried in an inter-layer insulating film 12, an inter-layer insulating film 18 of a stopper layer 16, an SiOCH film 18a and an organic insulating film 18c, and a first hard mask 20 are formed.

An interconnection trench 32 is formed in the first hard mask 20 and the organic insulating film 18c. In the SiOCH film 18a and the stopper layer 16, via-holes 26 having increased-width portions 34 on the side of the interconnection trench 32 are formed. An interconnection 40 formed of a barrier metal 36 and a Cu film 38 is buried in the via-holes 26 and the interconnection trench 32, connected to the interconnection 14 via the via-holes 26.

As described above, the semiconductor device according to the present embodiment is the same as the semiconductor device according to the first embodiment shown in FIG. 1 except that in the former the inter-layer insulating film 18 is formed of the SiOCH film 18a and the organic insulating film 18c. The increased-width portions 34 of the via-holes 26 on the side of the interconnection trench 32 of the semiconductor device of such structure widen the opening of the via-holes 26. This facilitates the deposition of the barrier metal 36 and the Cu film 38 in the via-holes 26 and can prevent the generation of defective filling. Accordingly, the reliability of the interconnection can be improved.

Next, the method for fabricating the semiconductor device according to the present embodiment will be explained with reference to FIGS. 18A to 24B. When the method for fabricating the semiconductor device according to the first to the third embodiments is applied to the semiconductor device according to the present embodiment, in which the inter-layer insulating film 18 includes the organic insulating film 18c, the organic insulating film 18c is also etched when the ArF photoresist films 24, 30 are removed by ashing. Then, when the inter-layer insulating film 18 includes the organic insulating film 18c, the following point must be considered.

First, on the substrate 10, a 50 nm-thick SiCH film, for example, is deposited by, e.g., plasma CVD method. Thus, the stopper layer 16 of the SiCH film is formed on the substrate 10.

Next, on the stopper layer 16, the SiOCH film 18a of, e.g., a 160 nm-thick is formed by, e.g., plasma CVD method.

Then, on the SiOCH film 18a, a 150 nm-thick organic polymer film 18c formed of an organic polymer (e.g., SiLK (registered trademark) from The Dow Chemical Company) is formed by, e.g., spin coating method.

Thus, on the stopper layer 16, the inter-layer insulating film 18 of the SiOCH film 18a and the organic insulating film 18c is formed.

Next, on the inter-layer insulating film 18, a 50 nm-thick SiOCH film, for example, a 100 nm-thick $SiO_2$ film, for example, a 70 nm-thick SiCH film, for example, are grown by, e.g., plasma CVD method. Thus, a first hard mask 20 of the SiOCH film, a second hard mask 22 of the $SiO_2$ film and a third hard mask 42 of the SiCH film are formed.

The first hard mask 20 is a film which is used as the mask mainly in forming the via-holes in the inter-layer insulating film 18. The second hard mask is a film which is used as the mask mainly in forming the interconnection trench in the inter-layer insulating film 18. Accordingly, the constituent materials of these hard masks are selected out of materials which can ensure the etching selectivity with respect to the inter-layer insulating film 18. The first hard mask 20 and the second hard mask 22, and the second hard mask and the third hard mask are formed of materials which can mutually ensure the etching selectivity. When the inter-layer insulating film 18 to be etched includes an organic insulating film as in the present embodiment, it is preferable that the first to the third hard masks are formed of SiO, SiN, SiOCH, SiCH, etc.

Figure 18A:
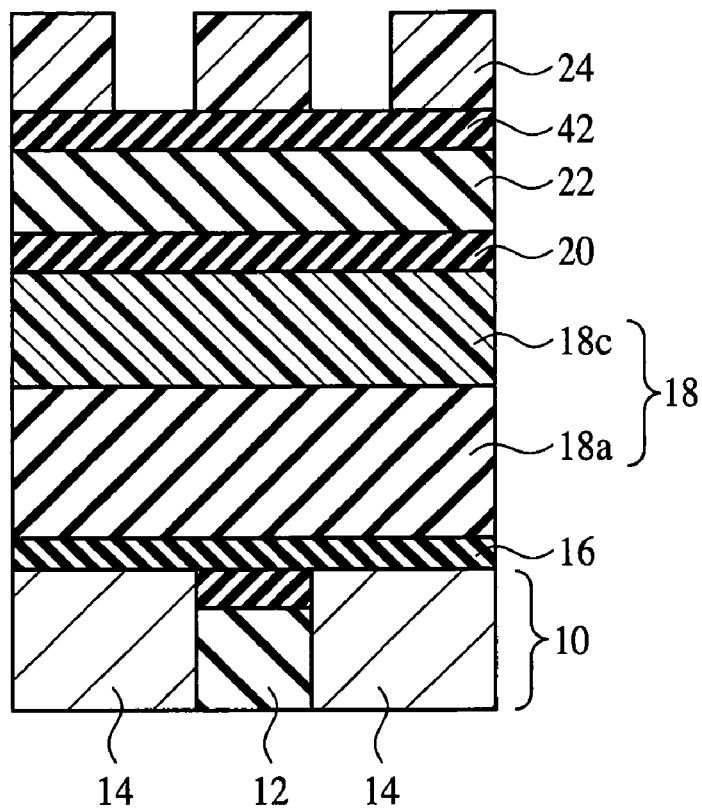
FIGS. 18A-18B, 19A-19B, 20A-20B, 21A-21B, 22A-22B, 23A-23B, and 24A-24B are sectional views showing the method for fabricating the semiconductor device according to the fourth embodiment of the present invention.

Next, on the third hard mask 42, an ArF photoresist film 24 exposing the via-hole forming regions is formed by photolithography (FIG. 18A). The film thickness of the ArF photoresist film 24 is, e.g., 300 nm, and the opening diameter of the via-hole forming regions is, e.g., 100 nmΦ.

Then, with the ArF photoresist film 24 as the mask, the third hard mask 42, the second hard mask 22 are sequentially anisotropically etched to open the via-holes 26 down to the second hard mask 22.

Figure 18B:
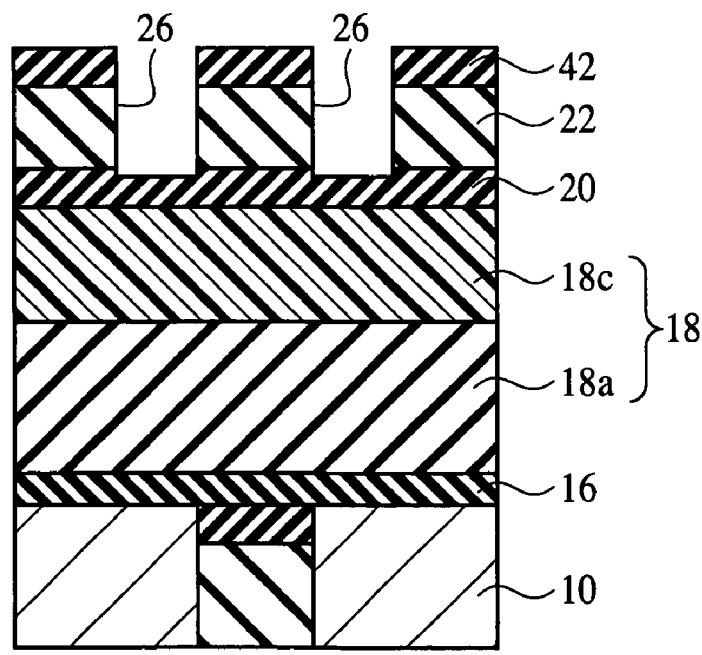

Next, the ArF photoresist film 24 is removed by, e.g., ashing (FIG. 18B).

Then, a 1 μm-thick resin film, for example, is formed by, e.g., spin coating method, and then the resin film is etched back by dry etching using, e.g., oxygen plasmas. Thus, the resin film 28 is buried in the via-holes 26, and the surface is planarized.

Figure 19A:
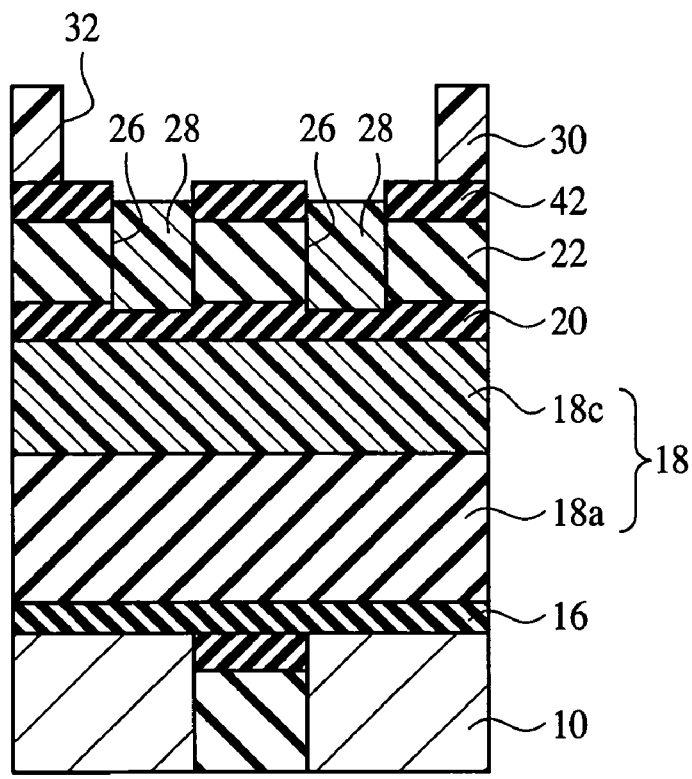

Next, on the third hard mask 42 with the resin film 28 buried in, an ArF photoresist film 30 exposing the interconnection trench forming region is formed by photolithography (FIG. 19A). The film thickness of the ArF photoresist film 30 is set to, e.g., 300 nm.

Next, with the ArF photoresist film 30 as the mask and with the second hard mask 22 and the resin film 20 as the stopper, the third hard mask 42 is anisotropically etched to open the interconnection trench 32 down to the second hard mask 22.

Figure 19B:
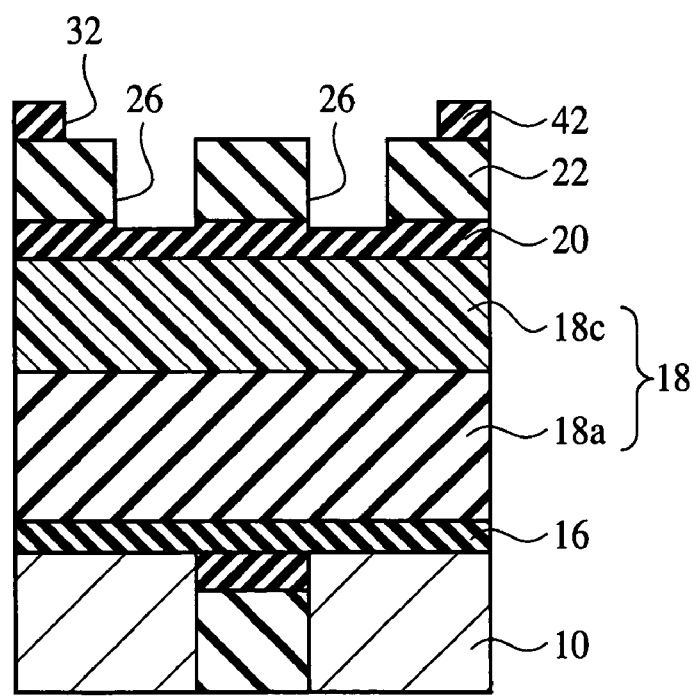

Next, the ArF photoresist film 30 and the resin film 28 are removed by, e.g., ashing (FIG. 19B).

Figure 20A:
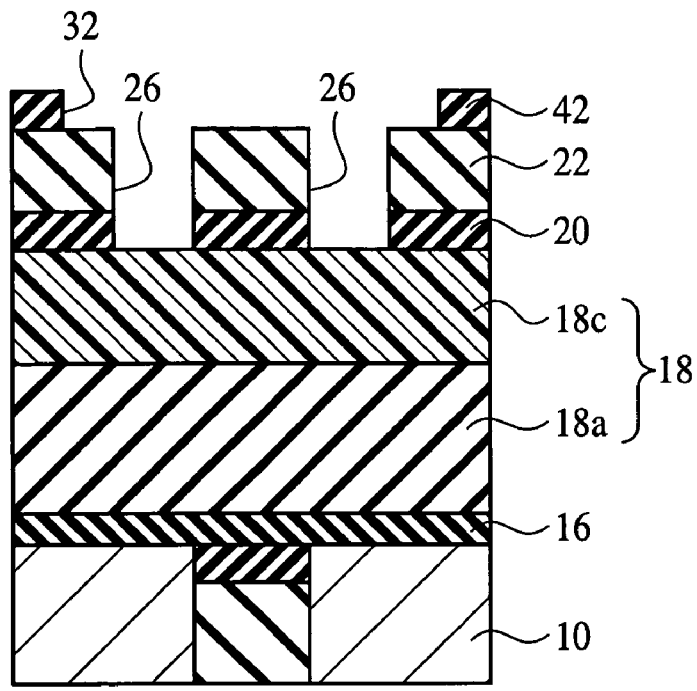

Next, with the second hard mask 22 and the third hard mask 42 as the mask and with the organic insulating film 18c as the stopper, the first hard mask 20 is anisotropically etched to open the via-holes 26 down to the organic insulating film 18c (FIG. 20A).

Figure 20B:
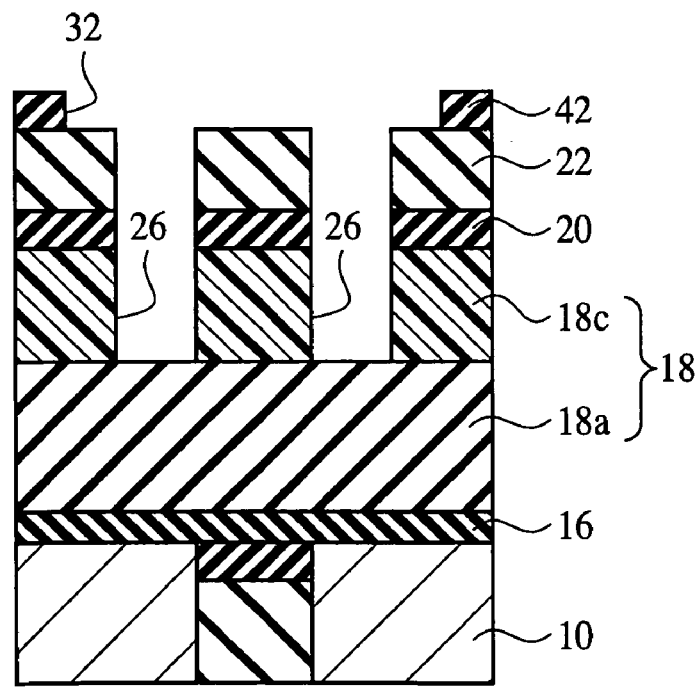

Next, with the second hard mask 22 and the third hard mask 42 as the mask and with the SiOCH film 18a as the stopper, the organic insulating film 18c is anisotropically etched to open the via-holes 26 down to the SiOCH film 18a (FIG. 20B).

Figure 21A:
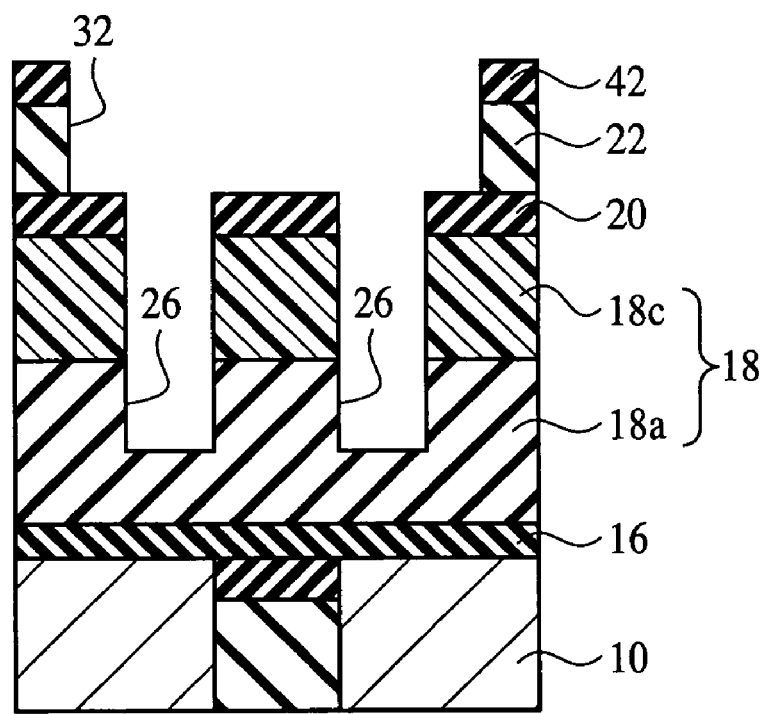

Next, with the first hard mask 20 and the third hard mask 42 as the mask, the second hard mask 22 and the SiOCH film 18a are anisotrpically etched to open the interconnection trench 32 down to the first hard mask 22 and open the via-holes down to the middle of the SiOCH film 18a (FIG. 21A).

Then, with the second hard mask 22 as the mask, the first hard mask 20 is isotropically etched down to the middle thereof, e.g., by about 20 nm-thick. Conditions for the etching at this time are those which make the etching selectivity of the first hard mask 20 with respect to the organic insulating film 18c sufficiently large, e.g., a 30 sccm $CH_2F_2$ gas flow rate, a 5 sccm $O_2$ gas flow rate, a 100 sccm $N_2$ gas flow rate, a 100 mTorr processing chamber internal pressure and a 200 W power.

Figure 21B:
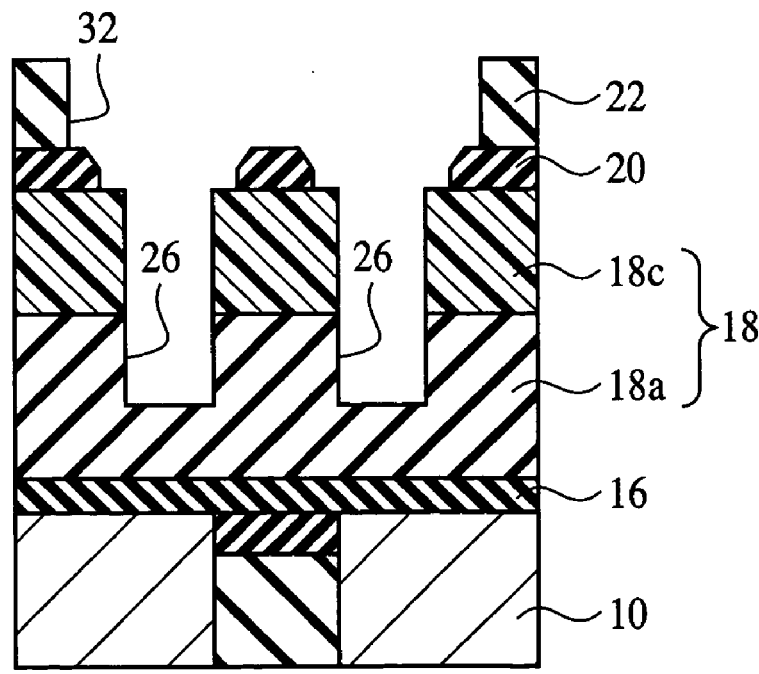

The isotropic etching of the first hard mask 20 advances respectively depth-wise from the surface of the first hard mask 20 and horizontally from the side wall of the via-holes 26. Accordingly, when the etching of the first hard mask 20 is paused, the upper surface of the inter-layer insulating film 18 is exposed at the peripheries of the via-holes 26, and the thickness of the first hard mask 20 in the interconnection trench 32 except the peripheries of the via-holes 26 is decreased (FIG. 21B). The third hard mask 42 is removed by the etching of the first hard mask 22.

Then, with the second hard mask 22 as the mask, the first hard mask 20 remaining in the interconnection trench 32 is anisotropically etched. At this time, the first hard mask 20 is etched under etching conditions which make the etching selectivity of the first hard mask 20 with respect to the inter-layer insulating film 18, at least the organic insulating film 18c small. Etching conditions are, e.g., a 50 sccm $CH_2F_2$ gas flow rate, a 10 sccm $O_2$ gas flow rate, a 100 sccm $N_2$ gas flow rate, a 20 mTorr processing chamber internal pressure and a 200 W power.

Figure 22A:
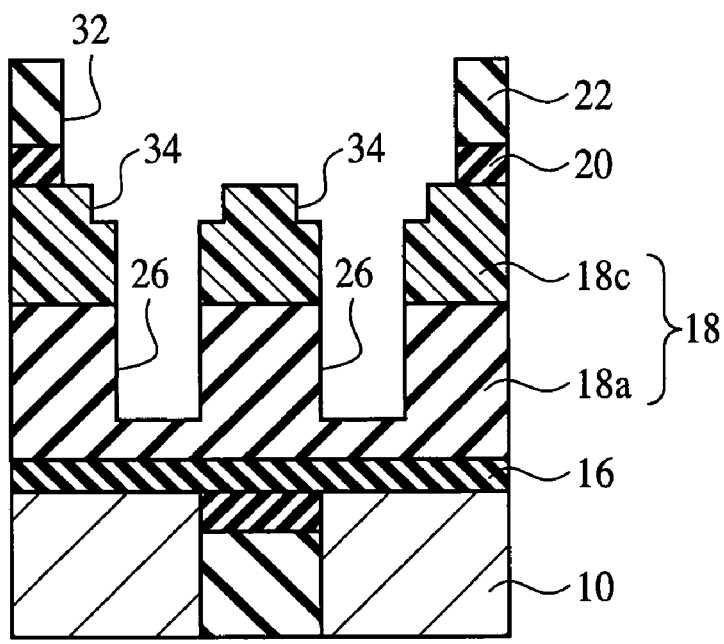

Thus, the interconnection trench 32 is opened down to the inter-layer insulating film 18. At the peripheries of the via-holes 26, where the first hard mask 20 has not been formed, the organic insulating film 18c is etched. Thus, at the peripheries of the via-holes 26 on the side of the surface of the organic insulating film 18c, the increased-width portions 34 as shown which reflect the configuration of the first hard mask 20 before etched are formed (FIG. 22A). The opening diameter of the width-increased portions 34 is, e.g., about 140 nm.

Then, with the second hard mask 22 as the mask, the organic insulating film 18c is anisotropically etched. Etching conditions are, e.g., a 300 sccm $NH_3$ gas flow rate, a 300 mTorr processing chamber internal pressure and a 200 W power.

Figure 22B:
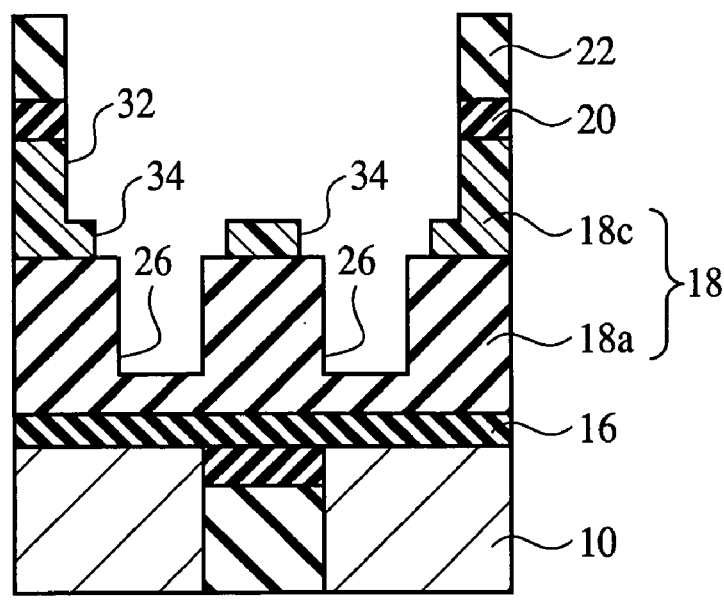

Thus, the increased-width portions 34 of the via-holes 26 arrived at the SiOCH film 18a (FIG. 22B).

Next, with the second hard mask 22 and the organic insulating film 18c as the mask, the SiOCH film 18a is anisotropically etched. Etching conditions are, e.g., a 30 sccm $C_4F_6$ gas flow rate, a 5 sccm $O_2$ gas flow rate, a 300 sccm $N_2$ gas flow rate, a 30 mTorr processing chamber internal pressure and a 1000 W power.

Figure 23A:
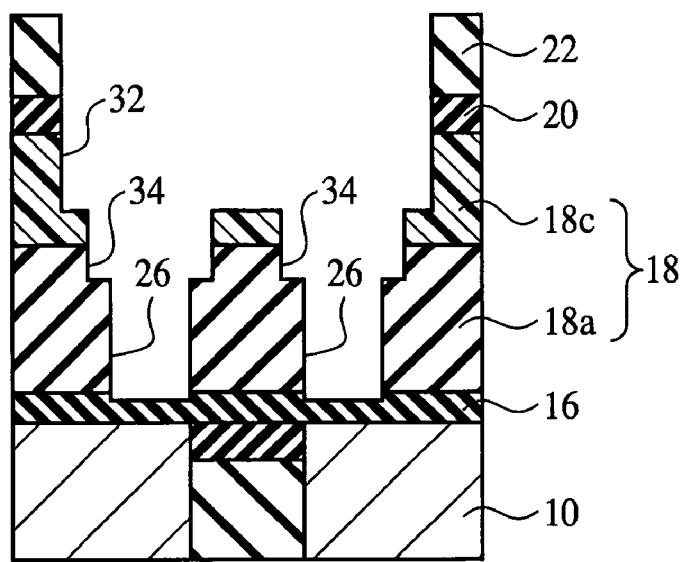

Thus, the increased-width portions 34 of the via-holes 26 are formed on the upper surface of the SiOCH film 18a (FIG. 23A).

Next, with the second hard mask 22 as the mask, the organic insulating film 18c is anisotropically etched. Etching conditions are, e.g., a 300 sccm $NH_3$ gas flow rate, a 50 mTorr processing chamber internal pressure and a 300 W power.

Figure 23B:
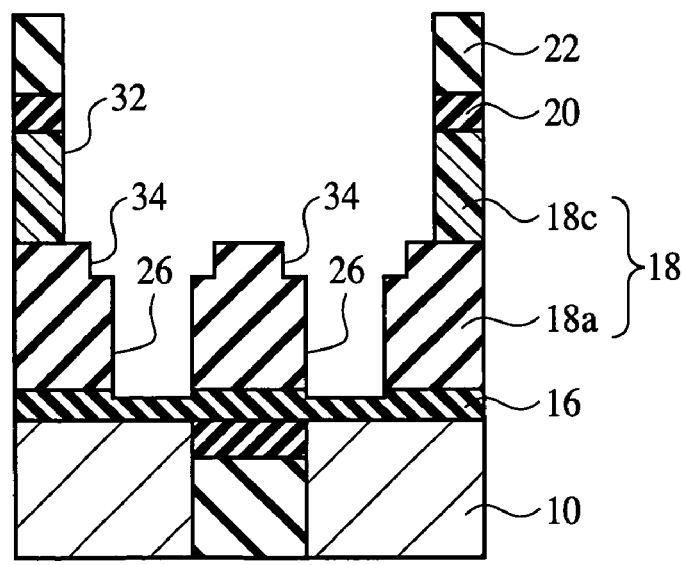

Thus, the interconnection trench 32 is opened down to the SiOCH film 18a (FIG. 23B).

Next, with the second hard mask 22 as the mask the stopper layer 16 is anisotropically etched. Etching conditions are, e.g., a 100 sccm $CF_4$ gas flow rate, a 50 sccm $CHF_3$ gas flow rate, a 200 mTorr processing chamber internal pressure and a 500 W power.

Figure 24A:
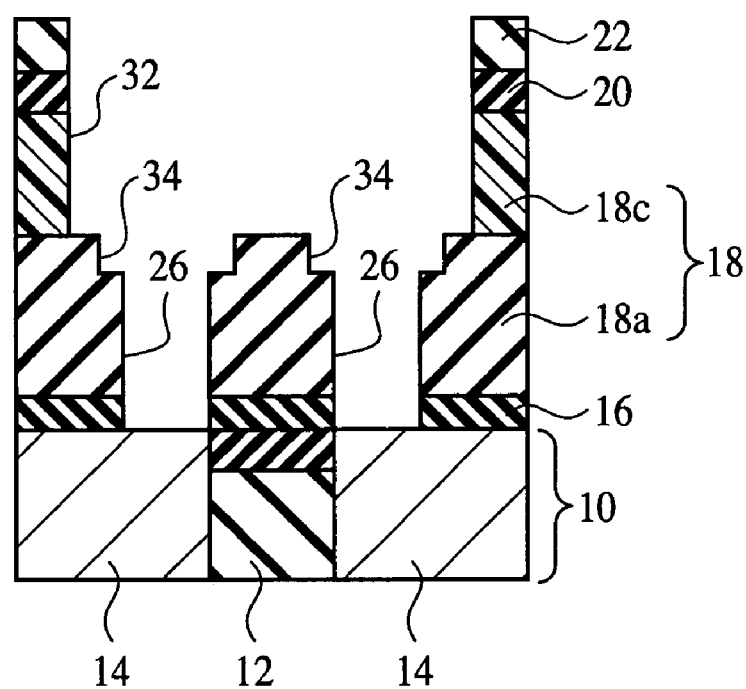

Thus, in the SiOCH film 18a and the stopper layer 16, the via-holes 26 having the increased-width portions 34 are formed down to the interconnection 14 (FIG. 24A).

Next, a barrier metal and a Cu seed are formed by sputtering method, and Cu plating is made. Thus, the via-holes 26 and the interconnection trench 32 are filled with the barrier metal 36 and the Cu film 38.

Figure 24B:
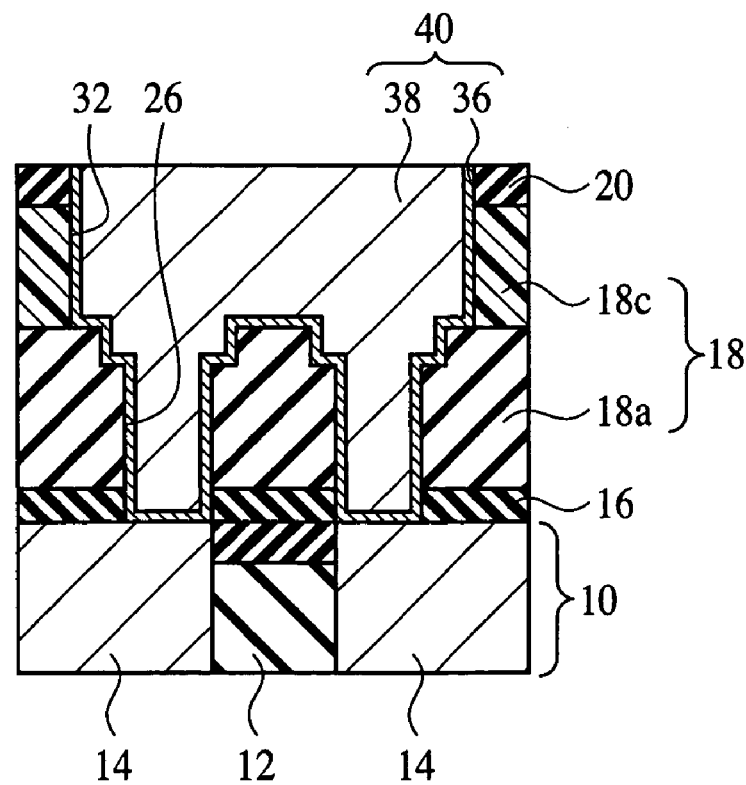

Then, the Cu film 38, the barrier metal 36 and the second hard mask 22 are polished by CMP method until the first hard mask 20 is exposed to leave the Cu film 38 and the barrier metal 36 selectively in the via-holes and the interconnection trench 32. Thus, in the via-holes 26 and the interconnection trench 32, an interconnection 40 formed of the barrier metal 36 and the Cu film 38 and connected to the interconnection 14 is formed (FIG. 24B).

As described above, according to the present embodiment, when the interconnection is formed by the dual damascene process, the first hard mask used in mainly forming the via-holes is isotropically etched under conditions for making the etching selectivity with respect to the inter-layer insulating film sufficiently large and then anisotropically etched under conditions for making the etching selectivity with respect to the inter-layer insulating film sufficient small, to remove the first hard mask in the interconnection trench forming region, whereby the via-holes having the increased-width portions can be formed on the side of the interconnection trench. This facilitates the deposition of the barrier metal and the Cu film in the via-holes, and the defective filling, such as voids, etc. can be suppressed. Accordingly, the reliability of the interconnections can be improved.

Modified Embodiments

The present invention is not limited to the above-described embodiments and can cover other various modifications.

For example, in the fourth embodiment described above, the isotropic etching of the first hard mask 20 is used to form the via-holes having the increased-width portions 34. However, as in the third embodiment, the isotropic etching of the second hard mask 22 can be used to form the via-holes 26 having the increased-width portions 34. In this case, in the step of FIG. 20B, the second hard mask 22 is isotropically etched into the same configuration shown in FIG. 14B, the second hard mask 22 and the first had mask are anisotropically etched into the configuration shown in FIG. 15A, and then the steps of FIG. 21B and the followers.

The inter-layer insulating film 18 is formed of the layer film of the SiOCH film 18a and the porous silica film 18b in the first to the third embodiments and is formed the SiOCH film 18a and the organic insulating film 18c of SiLK in the fourth embodiment. However, the materials of the inter-layer insulating film are not limited to them. The materials forming the inter-layer insulating film can be suitably selected in accordance with a required dielectric constant, strength, etc.

The inorganic insulating film of low dielectric constant can be, e.g., porous silica film, porous SiOC film, porous SiOCH film or others. The inorganic insulating film of low dielectric constant can be, e.g., SiLK (registered trademark) of an organic polymer from The Dow Chemical Company, FLARE (registered trademark) of an organic polymer from Honeywell Electronic Materials or others.

The inter-layer insulating film 18 does not have essentially the two-layer structure and may be formed of one insulating layer. The inter-layer insulating film may be formed of a layer film of 3 or more layers. The stacked structure may have an intermediate stopper layer inserted.

What is claimed is:

1. A method for fabricating a semiconductor device comprising the steps of:

sequentially forming over a substrate an insulating film, a first mask, and a second mask whose etching characteristics are different from those of the first mask;

forming on the second mask a photoresist film exposing a via-hole forming region;

anisotropically etching the second mask and the first mask in the via-hole forming region with the photoresist film as a mask;

anisotropically etching the insulating film in the via-hole forming region down to the middle thereof with the photoresist film, the second mask and the first mask as a mask;

removing the second mask in an interconnection trench forming region containing the via-hole forming region;

isotropically etching the first mask with the second mask as a mask to expose an upper surface of the insulating film at a peripheral region of the via-hole forming region and to leave the first mask in the interconnection trench forming region except the peripheral region;

anisotropically etching the first mask and the insulating film with the second mask as a mask to form in the insulating film a via-hole having an increased-width portion at an upper part and an interconnection trench connected to the increased-width portion of the via-hole; and filling an interconnection in the via-hole and the interconnection trench.

2. A method for fabricating a semiconductor device according to claim 1, wherein the step of forming the via-hole and the interconnection trench includes the steps of:

anisotropically etching the first mask under conditions which make an etching selectively with respect to the insulating film small to thereby etch the first mask on the insulating film and selectively etch the insulating film at the peripheral region to form the increased-width portions; and anisotropically etching the insulating film to deepen the via-hole down to the substrate and to form the interconnection trench.

3. A method for fabricating a semiconductor device comprising the steps of:

sequentially forming over a substrate an insulating film, a first mask, and a second mask whose etching characteristics are different from those of the first mask;

forming on the second mask a photoresist film exposing an via-hole forming region;

anisotropically etching the second mask in the via-hole forming region with the photoresist film as a mask;

removing the photoresist film;

anisotropically etching the first mask in the via-hole forming region with the second mask as a mask;

anisotropically etching the insulating film in the via-hole forming region down to the middle thereof with the second mask as a mask;

removing the second mask in an interconnection trench forming region containing the via-hole forming region;

isotropically etching the first mask with the second mask as a mask to expose an upper surface of the insulating film in a peripheral region of the via-hole forming region and to leave the first mask in the interconnection trench forming region except the peripheral region;

anisotropically etching the first mask and the insulating film with the second mask as a mask to form in the insulating film a via-hole having an increased-width portion at an upper part and an interconnection trench connected to the increased-width portion of the via-hole; and filling an interconnection in the via-hole and the interconnection trench.

4. A method for fabricating a semiconductor device according claim 1, which further comprises the steps of:

forming on the second mask a third mask whose etching characteristics are different from those of the second mask; and removing the third mask in the interconnection trench forming region, and in which in the step of removing the second mask in the interconnection trench forming region, the second mask is anisotropically etched with the third mask as a mask.

5. A method for fabricating a semiconductor device according to claim 1, wherein a configuration of the increased-width portion of the via-hole is controlled by controlling an etching amount of the first mask in the step of isotropically etching the first mask.

6. A method for fabricating a semiconductor device comprising the steps of:

sequentially forming over a substrate an insulating film, a first mask, a second mask whose etching characteristics are different from those of the first mask, and a third mask whose etching characteristics are different from those of the second mask;

removing the first mask, the second mask and the third mask in a via-hole forming region;

anisotropically etching the insulating film in the via hole forming region to the middle thereof;

removing the third mask in the interconnection trench forming region containing the via-hole forming region;

isotropically etching the second mask with the third mask as a mask to expose an upper surface of the first mask at a peripheral region of the via-hole forming region and to leave the second mask in the interconnection trench forming region except the peripheral region;

anisotropically etching the second mask, the first mask and the insulating film with the third mask as a mask to form in the insulating film a via-hole having an increased-width portion at an upper part, and an interconnection trench connected to the increased-width portion of the via-hole; and filling an interconnection in the via-hole and the interconnection trench.

7. A method for fabricating a semiconductor device according to claim 6, wherein the step of forming the via-hole and the interconnection trench includes the steps of:

anisotropically etching the second mask under conditions which make an etching selectivity with respect to the first mask small to etch the second mask on the first mask and selectively etch the first mask at the peripheral region;

anisotropically etching the first mask under conditions which make an etching selectivity with respect to the insulating film small to etch the first mask on the insulating film and etch the insulating film selectively at the peripheral region to form the increased-width portion; and further anisotropically etch the insulating film to deepen the via-hole down to the substrate and form the interconnection trench.

8. A method for fabricating a semiconductor device according to claim 6, wherein the step of removing the third mask, the second mask and the first mask formed in the via-hole forming region includes the steps of:

forming on the third mask a photoresist film exposing the via-hole forming region; and anisotropically etching the third mask, the second mask and the first mask with the photoresist film as a mask, and in the step of anisotropically etching the insulating film in the via-hole forming region, the insulating film is etched with the photoresist film, the third mask, the second mask and the first mask as a mask.

9. A method for fabricating a semiconductor device according to claim 6, wherein the step of removing the third mask, the second mask and the first mask in the via-hole forming region includes the steps of:

forming on the third mask a photoresist film exposing the via-hole forming region;

anisotropically etching the third mask and the second mask in the via-hole forming region with the photoresist film as the mask;

removing the photoresist film; and anisotropically etching the first mask in the via-hole forming region with the third mask and the second mask as a mask.

10. A method for fabricating a semiconductor device according to claim 6, wherein a configuration of the increased-width portion of the via-hole is controlled by controlling an etching amount of the second mask in the step of isotropically etching the second mask.

11. A method for fabricating a semiconductor device according claim 3, which further comprises the steps of:

forming on the second mask a third mask whose etching characteristics are different from those of the second mask; and removing the third mask in the interconnection trench forming region, and in which in the step of removing the second mask in the interconnection trench forming region, the second mask is anisotropically etched with the third mask as a mask.

12. A method for fabricating a semiconductor device according to claim 3, wherein a configuration of the increased-width portion of the via-hole is controlled by controlling an etching amount of the first mask in the step of isotropically etching the first mask.

* * * * *